(12) United States Patent
Miyamoto et al.

(10) Patent No.: US 11,809,739 B2
(45) Date of Patent: Nov. 7, 2023

(54) MEMORY SYSTEM

(71) Applicant: KIOXIA CORPORATION, Tokyo (JP)

(72) Inventors: Sachiyo Miyamoto, Yokohama Kanagawa (JP); Terufumi Takasaki, Yokohama Kanagawa (JP); Kenji Sakaue, Yokohama Kanagawa (JP); Taro Iwashiro, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 3 days.

(21) Appl. No.: 17/589,583

(22) Filed: Jan. 31, 2022

(65) Prior Publication Data

US 2022/0391130 A1 Dec. 8, 2022

(30) Foreign Application Priority Data

Jun. 7, 2021 (JP) .................................. 2021-095120

(51) Int. Cl.
*G06F 3/06* (2006.01)
(52) U.S. Cl.
CPC .......... *G06F 3/0655* (2013.01); *G06F 3/0604* (2013.01); *G06F 3/0652* (2013.01); *G06F 3/0679* (2013.01)
(58) Field of Classification Search
CPC .... G06F 3/0604; G06F 3/0625; G06F 3/0652; G06F 3/0655; G06F 3/0659; G06F 3/0679; G11C 16/32; G11C 7/1063; G11C 16/26; G11C 16/16; G11C 16/0483
USPC .................................................. 711/154, 103
See application file for complete search history.

(56) References Cited

U.S. PATENT DOCUMENTS

| | | | |
|---|---|---|---|
| 5,341,330 A * | 8/1994 | Wells ................... | G11C 16/102 365/185.11 |
| 6,456,538 B1 | 9/2002 | Song et al. | |
| 7,516,371 B2 | 4/2009 | Sakaue et al. | |
| 2009/0207663 A1* | 8/2009 | Kang ..................... | G11C 29/44 365/201 |
| 2020/0057580 A1* | 2/2020 | Kim .................... | G11C 16/3418 |
| 2020/0301611 A1 | 9/2020 | Sia et al. | |

FOREIGN PATENT DOCUMENTS

| JP | 3759707 B2 | 3/2006 |
|---|---|---|
| JP | 4550439 B2 | 9/2010 |
| JP | 2020154759 A | 9/2020 |

\* cited by examiner

*Primary Examiner* — Hashem Farrokh
(74) *Attorney, Agent, or Firm* — Kim & Stewart LLP

(57) ABSTRACT

A memory system includes a nonvolatile memory, and a memory controller configured to control the nonvolatile memory. The nonvolatile memory stores a busy table. The memory controller loads the busy table and controls a chip enable signal for the nonvolatile memory based on the busy table.

20 Claims, 16 Drawing Sheets

| | TIME |
|---|---|
| tR | 100us |
| tPROG | 5ms |
| tBERASE | 10ms |

| | TIME | | | | |
|---|---|---|---|---|---|
| | BLK1 | BLK2 | BLK3 | ... | BLKn |
| tR | 100us | 97us | 95us | ... | 98us |
| tPROG | 5ms | 3ms | 2ms | ... | 4ms |
| tBERASE | 10ms | 8ms | 7ms | ... | 9ms |

MEMORY SYSTEM

CROSS-REFERENCE TO RELATED APPLICATION

This application is based upon and claims the benefit of priority from Japanese Patent Application No. 2021-095120, filed Jun. 7, 2021, the entire contents of which are incorporated herein by reference.

FIELD

Embodiments described herein generally relate to a memory system.

BACKGROUND

A memory system including a nonvolatile memory such as a NAND flash memory and a memory controller is known, the memory controller controlling the nonvolatile memory based on a command received from an external apparatus including a host apparatus.

DETAILED DESCRIPTION

Embodiments provide a memory system mounted with a nonvolatile memory, with which it is possible to reduce power consumption.

In general, according to one embodiment, a memory system includes a nonvolatile memory and a memory controller configured to control the nonvolatile memory. The nonvolatile memory stores a busy table. The memory controller loads the busy table and controls a chip enable signal for the nonvolatile memory based on the busy table.

Hereinafter, embodiments will be described.

1. First Embodiment

A memory system according to a first embodiment will be described using FIGS. 1 to 10.

1.1. Configuration

A configuration of the memory system according to the first embodiment will be described using FIGS. 1 to 4.

Figure 1:
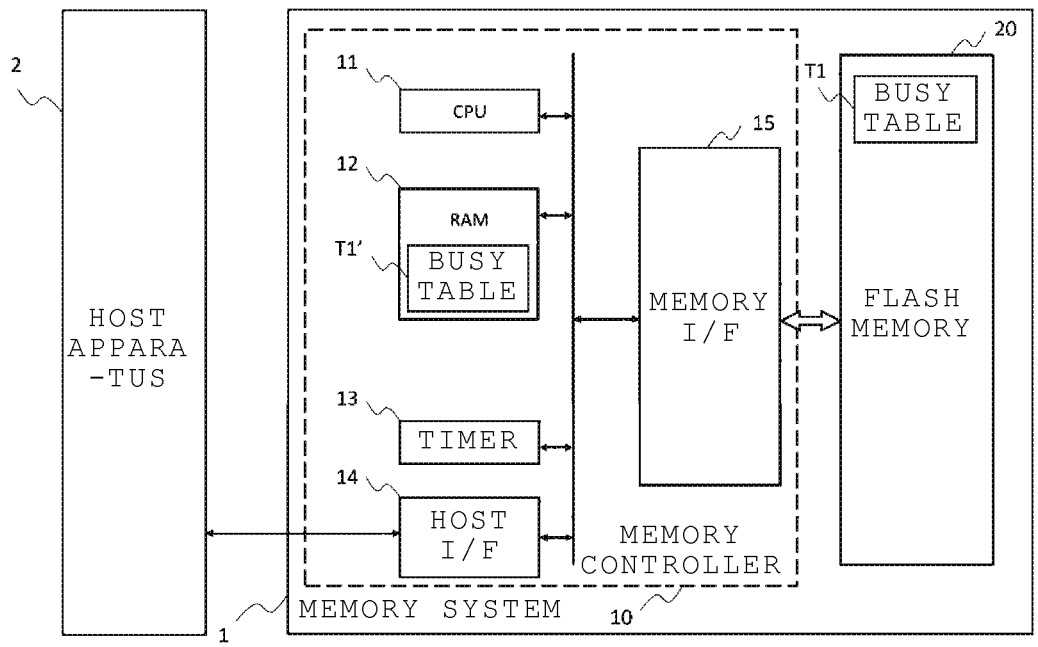
FIG. 1 is a block diagram illustrating an example of a configuration of a memory system according to a first embodiment.

FIG. 1 is a block diagram illustrating an example of the configuration of the memory system according to the first embodiment. The memory system 1 includes a nonvolatile memory and a memory controller 10 and is controlled by a host apparatus 2. This memory system 1 is, for example, a SD® card or a solid state drive (SSD).

The nonvolatile memory is controlled by the memory controller 10. In addition, the nonvolatile memory can store, for example, a firmware or a busy table T1. Examples of the nonvolatile memory include a NAND flash memory, a NOR flash memory, a magneto-resistive random access memory (MRAM), a phase change random access memory (PRAM), a resistive random access memory (ReRAM), and a ferroelectric random access memory (FeRAM). In the present specification, as an example of the nonvolatile memory, a NAND flash memory (hereinafter, simply referred to as "flash memory") 20 is used.

The memory controller 10 receives a command from the host apparatus 2 and controls the flash memory 20 based on the received command. The memory controller 10 can be implemented by a circuit such as a system on a chip (SoC). The memory controller includes a central processing unit (CPU) 11, a random access memory (RAM) 12, a timer 13, a host interface circuit (hereinafter, referred to as "host I/F") 14, and a memory interface circuit (hereinafter, referred to as "memory I/F") 15.

The CPU 11 can control an overall operation of the memory controller 10. For example, the CPU 11 controls various operations of the memory controller 10 by executing a firmware loaded into the RAM 12. Examples of the various operations include a write operation, a read operation, and an erasing operation.

The RAM 12 is an example of the volatile memory. For example, the RAM 12 can store a busy table T1' and a firmware loaded from the flash memory 20 and is used as a work area of the CPU 11. The RAM 12 temporarily stores data received from the host apparatus 2 or data read from the flash memory 20 and functions as a buffer and a cache. As a result, the memory controller 10 executes the various operations and some of functions of the host I/F 14 and the memory I/F 15.

In the busy table T1 stored in the flash memory and the busy table T1' loaded into the RAM 12, a busy time of the flash memory 20 is stored. As used herein, a "busy time" is a length of time during which flash memory 20 is in a busy state, which is a state in which the flash memory 20 cannot receive a command from the memory controller 10 during an operation. The timer 13 measures time elapsed from a start of the operation and the memory controller 10 tracks the measured elapsed time against the busy time of the flash memory 20 stored in the busy table T1'. Further, the memory controller 10 updates the busy time stored in the busy table T1 stored in the flash memory 20 based on the actual busy time of the flash memory 20.

The host I/F 14 is connected to the host apparatus 2 via a host bus and controls communication between the memory system 1 and the host apparatus 2. The host bus is a bus based on SD standards. The host I/F 14 controls transmission of data, a command, and an address between the memory system 1 and the host apparatus 2.

The memory I/F 15 is connected to the flash memory 20 via a NAND bus and controls communication between the memory controller 10 and the flash memory 20. The NAND bus is a bus that transmits and receives a signal based on a NAND interface.

Figure 2:
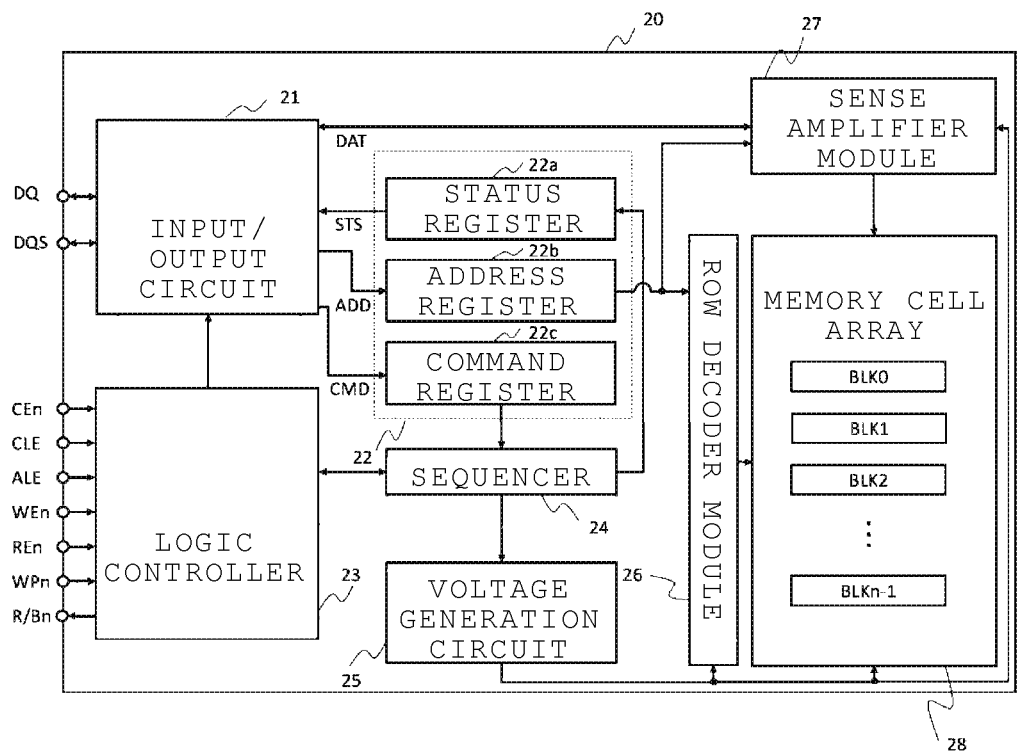
FIG. 2 is a block diagram illustrating an example of a configuration of a nonvolatile memory in the memory system according to the first embodiment.

FIG. 2 is a block diagram illustrating an example of a configuration of the nonvolatile memory in the memory system according to the first embodiment. As illustrated in FIG. 2, the flash memory 20 includes an input/output circuit 21, a register set 22, a logic controller 23, a sequencer 24, a voltage generation circuit 25, a row decoder module 26, a sense amplifier module 27, and a memory cell array 28.

The input/output circuit 21 transmits and receives a data signal DQ and a data strobe signal DQS to and from the memory controller 10. The data signal DQ is a 8-bit width signal including DQ0 to DQ7 and includes a data DAT, a status STS, an address ADD, and a command CMD. The data strobe signal DQS is a strobe signal corresponding to the data signal DQ. In addition, the input/output circuit 21 transmits and receives the data DAT to and from the sense amplifier module 27.

The register set 22 includes a status register 22a, an address register 22b, and a command register 22c. The status register 22a, the address register 22b, and the command register 22c store the status STS, the address ADD, and the command CMD, respectively.

The status STS is updated based on, for example, an operation state of the sequencer 24. In addition, the status STS is transmitted from the status register 22a to the input/output circuit 21 and is output to the memory controller 10 based on a command from the memory controller 10. The address ADD is transmitted from the input/output circuit 21 to the address register 22b and includes, for example, a chip address, a row address, and a column address. The command CMD is transmitted from the input/output circuit to the command register 22c, and includes a command relating to various operations of the memory controller 10 for the flash memory 20.

The logic controller 23 controls each of the input/output circuit 21 and the sequencer 24 based on a control signal received from the memory controller 10. As the control signal, for example, a chip enable signal CEn, a command latch enable signal CLE, an address latch enable signal ALE, a write enable signal WEn, a read enable signal REn, or a write-protect signal WPn is used. In addition, the logic controller 23 notifies the memory controller 10 of the control signal received from the sequencer 24. As the control signal, for example, a ready/busy signal R/Bn is used. "n" added to the name of a signal represents that the signal is low active.

The chip enable signal CEn is a signal for enabling the flash memory 20. The command latch enable signal CLE is a signal for notifying the input/output circuit 21 that the data signal DQ received from the memory controller 10 is the command CMD. The address latch enable signal ALE is a signal for notifying the input/output circuit 21 that the data signal DQ received from the memory controller 10 is the address ADD. The write enable signal WEn is a signal for instructing the input/output circuit 21 to input the data signal DQ. The read enable signal REn is a signal for instructing the input/output circuit 21 to output the data signal DQ. The write-protect signal WPn is a signal for preventing a write operation performed on the flash memory 20. The ready/busy signal R/Bn is a signal for notifying the memory controller 10 whether the flash memory 20 is a ready state or a busy state. In the description of the embodiment, "ready state" refers to a state where the flash memory 20 is able to receive a command from the memory controller 10, and "busy state" refers to a state where the flash memory 20 is not able to receive a command from the memory controller 10.

The sequencer 24 controls an overall operation of the flash memory 20 based on the command CMD stored in the command register 22c. For example, the sequencer 24 controls the sense amplifier module 27, the row decoder module 26, the voltage generation circuit 25, and the like to execute various operations.

The voltage generation circuit 25 generates a voltage required for the various operations based on the control by the sequencer 24. The voltage generation circuit 25 supplies the generated voltage to the row decoder module 26, the sense amplifier module 27, the memory cell array 28, and the like. For example, the voltage generation circuit 25 generates a voltage to be applied to a word line, a bit line and a source line in a read operation or a write operation. When the voltage generation circuit 25 generates the voltage to be applied to the word line, the voltage generation circuit 25 supplies the generated voltage to the row decoder module 26. When the voltage generation circuit 25 generates the voltage to be applied to the bit line, the voltage generation circuit 25 supplies the generated voltage to the sense amplifier module 27. When the voltage generation circuit 25 generates the voltage to be applied to the source line, the voltage generation circuit 25 supplies the generated voltage to the source line.

The row decoder module 26 receives a row address from the address register 22b and decodes the received row address. The row decoder module 26 selects a block BLK for which various operations are to be executed based on the result of decoding result. The row decoder module 26 can transmit the voltage supplied from the voltage generation circuit 25 to the selected block BLK.

The sense amplifier module 27 includes a sense amplifier and a data latch (not illustrated). The sense amplifier reads the data DAT from the memory cell array 28. The data latch temporarily stores the data DAT read from the memory cell array 28 or write data received from the memory controller 10 via the input/output circuit 21.

The memory cell array 28 stores data from the memory controller 10. The memory cell array 28 includes a plurality of blocks BLK0 to BLKn−1 (n represents an integer of 2 or more). The blocks BLK0 to BLKn−1 function as, for example, a minimum unit of an erasing operation of data. Each of the blocks BLK includes a plurality of pages. Each of the pages includes a plurality of memory cells connected to the same word line. The page functions as a unit of a write operation and a read operation.

Figures 3, 4:
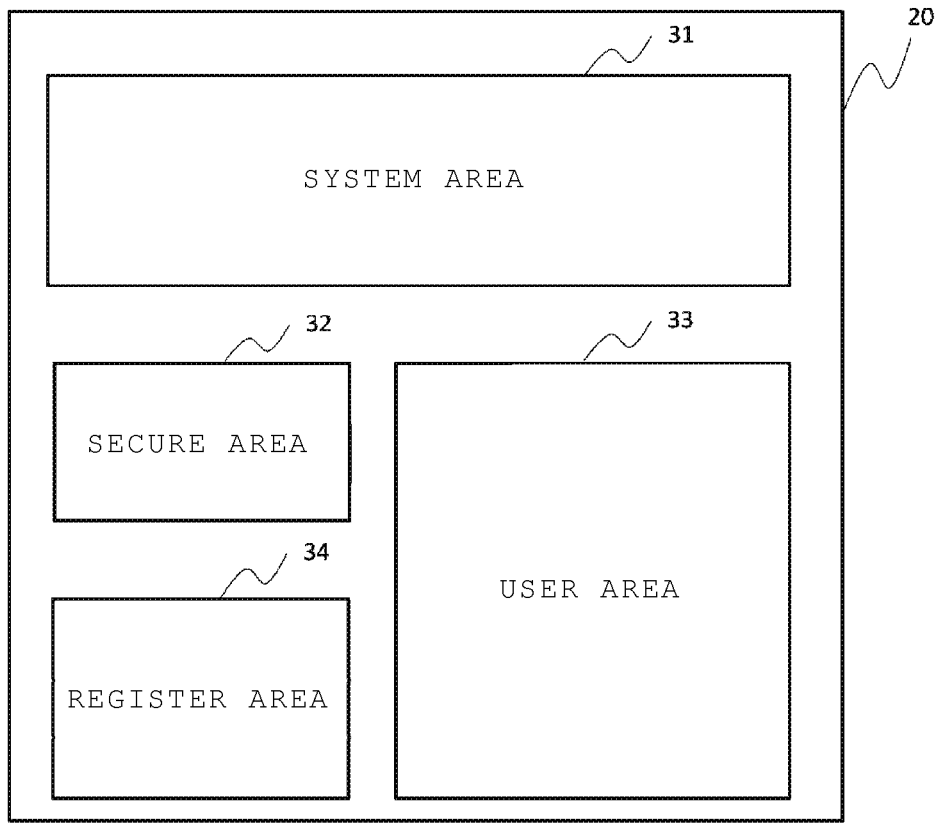
FIG. 3 is a diagram schematically illustrating an example of a storage area of the nonvolatile memory in the memory system according to the first embodiment.
FIG. 4 is an example of a busy table that contains the length of various operation times of the nonvolatile memory in the memory system according to the first embodiment.

FIG. 3 is a diagram schematically illustrating an example of a storage area of the nonvolatile memory in the memory system according to the first embodiment. The storage area of the flash memory 20 includes, for example, a system area 31, a secure area 32, a user area 33, and a register area 34.

The system area 31 stores, for example, control software or firmware for allowing the memory system 1 to operate, the busy table T1, and other system data. The system area 31 is an area to which the host apparatus 2 cannot get access directly.

The secure area 32 stores secure data. In order to get access to the secure area, the host apparatus 2 needs to be authenticated.

The user area 33 is an area freely accessed using the host apparatus 2. The user area 33 is accessed, for example, when the memory controller 10 executes various operations for the flash memory 20.

The register area 34 is an area where data including the specification or operation conditions of the flash memory 20 is stored.

FIG. 4 is an example of a busy table that contains lengths of various operation times of the nonvolatile memory in the memory system according to the first embodiment. Numerical values in FIG. 4 are merely examples and can be freely changed.

The busy table T1 is stored in, for example, the system area 31 of the flash memory 20 and loaded into the RAM 12. The busy table T1 loaded into the RAM 12 is referred to herein as busy table T1'. The busy table T1' is referred to when the flash memory 20 executes various operations. For example, when requesting the flash memory 20 for various operations, the memory controller 10 controls the chip enable signal CEn based on the busy time stored in the busy table T1'.

In the embodiment, the busy time stored in the busy table T1 is a length of time during which the flash memory 20 cannot receive a command from the memory controller 10 during an operation, as described in the specification of the flash memory 20. In the embodiment, the busy time stored in the busy table T1 is a numerical value described in the specification of the flash memory 20, but the present disclosure is not limited thereto. The busy time stored in the busy table T1 may be a measured value of the busy time of the flash memory 20 in the memory system 1. In the busy table T1 and the busy table T1', for example, a length of time where the ready/busy signal R/Bn is in the busy state when the flash memory 20 executes various operations is stored. In the read operation, the busy time where the ready/busy signal R/Bn is in the busy state is represented by tR. In addition, in the write operation, the busy time where the ready/busy signal R/Bn is in the busy state is represented by tPROG. In addition, in the erasing operation, the busy time where the ready/busy signal R/Bn is in the busy state is represented by tBERASE.

1.2. Operation

Next, various operations of the memory system 1 according to the embodiment will be described using FIGS. 5 to 10.

1.2.1. Read Operation

The read operation of the memory system 1 according to the embodiment will be described using FIGS. 5 and 6.

Figure 5:
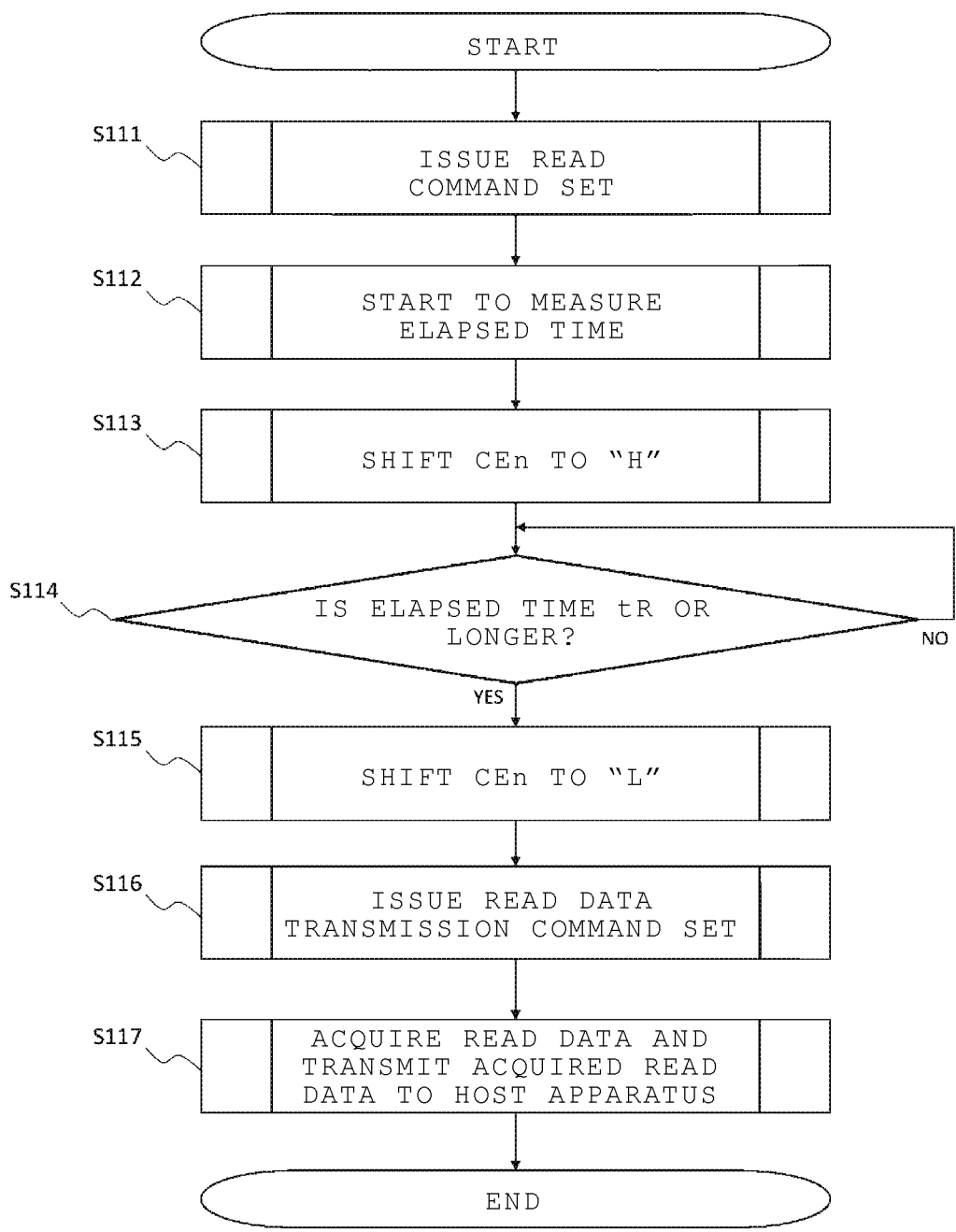
FIG. 5 is a flowchart illustrating an example of a read operation process of a memory controller in the memory system according to the first embodiment.

FIG. 5 is a flowchart illustrating an example of a read operation process of the memory controller in the memory system according to the first embodiment.

When the memory system 1 is powered on, the memory controller 10 loads the busy table T1 from the system area 31 of the flash memory 20 into the RAM 12 (busy table T1'). In the embodiment, an example where the busy table T1 is loaded into the RAM 12 when the memory system 1 is powered on is described. However, a timing at which the busy table T1 is loaded into the RAM 12 is not limited to this example.

When a data read command is received from the host apparatus 2, the memory controller 10 issues a read command set to the flash memory 20 (S111). In the embodiment, the read command set is a set including a command and an address relating to an operation where the sense amplifier module 27 reads data stored in the memory cell array 28. When the flash memory 20 receives the read command set, the sense amplifier module 27 starts the operation of reading data stored in the memory cell array 28.

When the sense amplifier module 27 starts the operation of reading data stored in the memory cell array 28, the flash memory 20 shifts the ready/busy signal R/Bn to the busy state. When the ready/busy signal R/Bn is shifted to the busy state, the memory controller 10 starts to measure elapsed time in the read operation using the timer 13 (S112).

When the memory controller 10 starts to measure the elapsed time in the read operation, the memory controller 10 shifts the chip enable signal CEn to "H" level (S113). That is, the memory controller 10 deasserts the chip enable signal CEn.

The memory controller 10 determines whether or not the elapsed time measured by the timer 13 is longer than or equal to the busy time tR stored in the busy table T1' (S114). When the memory controller 10 determines that the elapsed time is shorter than the busy time tR (S114; NO), the memory controller 10 repeats Step S114.

On the other hand, when the memory controller 10 determines that the elapsed time is longer than or equal to the busy time tR (S114; YES), the memory controller 10 shifts the chip enable signal CEn to "L" level (S115). That is, the memory controller 10 asserts the chip enable signal CEn. In the description of the embodiment, when the elapsed time is longer than or equal to the busy time tR, the memory controller 10 shifts the chip enable signal CEn to "L" level, but the present disclosure is not limited thereto. When the elapsed time is longer than or equal to the busy time tR, the memory controller 10 may check the ready/busy signal R/Bn, and shifts the chip enable signal CEn to "L" level when the ready/busy signal R/Bn is in the ready state but not when the ready/busy signal R/Bn is in the busy state.

When the sense amplifier module 27 ends the operation of reading data stored in the memory cell array 28, the flash memory 20 shifts the ready/busy signal R/Bn to the ready state. When the memory controller 10 confirms that the ready/busy signal R/Bn is in the ready state, the memory controller 10 issues a read data transmission command set to the flash memory 20 (S116). In the embodiment, the read data transmission command set is a set including a command and an address relating to an operation of transmitting the data read to the sense amplifier module 27 to the memory controller 10.

The memory controller 10 acquires the read data from the flash memory 20 through the operation of transmitting the data read to the sense amplifier module 27 to the memory controller 10. The memory controller 10 transmits the read data to the host apparatus 2 via the host I/F 14 (S117). Hereinabove, the read operation is completed.

Figure 6:
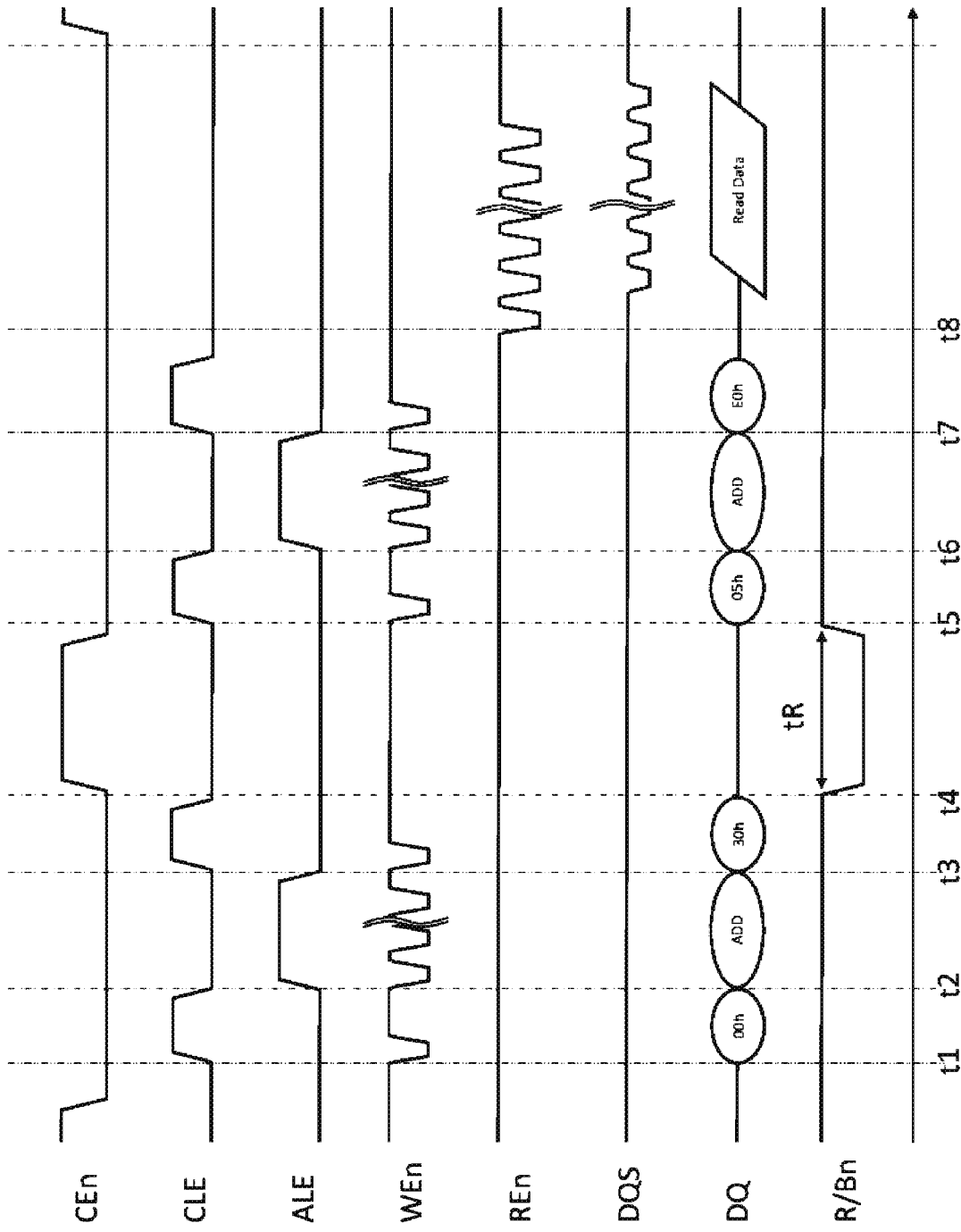
FIG. 6 is a timing chart illustrating an example of the read operation in the memory system according to the first embodiment.

FIG. 6 is a timing chart illustrating an example of the read operation in the memory system according to the first embodiment. The shift of the control signal in the read operation illustrated in FIG. 5 will be described using FIG. 6.

First, the memory controller 10 shifts the chip enable signal CEn from "H" level to "L" level. As a result, the chip enable signal CEn is asserted, and the memory controller 10 can get access to the flash memory 20.

Next, at t1, the memory controller 10 shifts the command latch enable signal CLE from "L" level to "H" level, and shifts the write enable signal WEn from "H" level to "L" level. As a result, the command latch enable signal CLE and the write enable signal WEn are asserted. The write enable signal WEn is shifted from "L" level to "H" level. In parallel to this operation, a command to instruct to input a data read destination address is transmitted to the flash memory 20 using the data signal DQ. The command to instruct to input a data read destination address is, for example, 00 h. After transmitting the command to instruct to input a data read destination address, the command latch enable signal CLE is deasserted to "L" level.

Next, at t2, the memory controller 10 shifts the address latch enable signal ALE from "L" level to "H" level. As a result, the address latch enable signal ALE is asserted. The memory controller 10 toggles the write enable signal WEn. As a result, the data read destination address can be transmitted from the memory controller 10 to the flash memory 20. At a timing corresponding to the write enable signal WEn, the memory controller 10 transmits the data read destination address to the flash memory 20 using the data signal DQ. After transmitting all the read destination addresses, the address latch enable signal ALE is deasserted to "L" level.

Next, at t3, the memory controller 10 shifts the command latch enable signal CLE from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, the memory controller 10 transmits a command to instruct to read data from the memory cell array 28 to the sense amplifier module 27 to the flash memory 20 using the data signal DQ. The command to instruct to read data from the memory cell array 28 to the sense amplifier module 27 is, for example, 30 h. After transmitting the command to instruct to read data from the memory cell array 28 to the sense amplifier module 27, the command latch enable signal is deasserted to "L" level. Hereinabove, the issuance of the read command set is completed.

At t4, the flash memory 20 starts the operation to read the data stored in the memory cell array 28 using the sense amplifier module 27. When the operation to read the data stored in the memory cell array 28 is started, the flash memory 20 shifts the ready/busy signal R/Bn from "H" level to "L" level. As a result, the ready/busy signal R/Bn enters "the busy state". The timing of starting the read operation using the sense amplifier module 27, and the timing at which the flash memory 20 shifts the ready/busy signal R/Bn from "H" level to "L" level may be the same.

While the ready/busy signal R/Bn is in the busy state ("L" level), that is, during the busy time tR in the read operation, the memory controller 10 shifts the chip enable signal CEn from "L" level to "H" level. As a result, the chip enable signal CEn is deasserted.

At t5 after the busy time tR in the read operation is elapsed, the memory controller 10 shifts the chip enable signal CEn from "H" level to "L" level. As a result, the chip enable signal CEn is asserted.

In addition, after the sense operation is completed, the flash memory 20 shifts the ready/busy signal R/Bn from "L" level to "H" level. As a result, the ready/busy signal R/Bn enters "the ready state".

Further, at t5, the memory controller 10 shifts the command latch enable signal CLE of the flash memory 20 from "L" level to "H" level, and shifts the write enable signal WEn from "H" level to "L" level. As a result, the command latch enable signal CLE and the write enable signal WEn are asserted. The write enable signal WEn is shifted from "L" level to "H" level. In parallel to this operation, a command to instruct to input a data read destination address is transmitted to the flash memory 20 using the data signal DQ. The command to instruct to input a data read destination address is, for example, 05 h. After transmitting the command to instruct to input a data read destination address, the command latch enable signal is deasserted to "L" level.

Next, at t6, the memory controller 10 shifts the address latch enable signal ALE of the flash memory 20 from "L" level to "H" level. As a result, the address latch enable signal ALE is asserted. The memory controller 10 toggles the write enable signal WEn. As a result, the data read destination address can be transmitted from the memory controller 10 to the flash memory 20. At a timing corresponding to the write enable signal WEn, the memory controller 10 transmits the data read destination address to the flash memory 20 using the data signal DQ. After transmitting all the read destination addresses, the address latch enable signal ALE is deasserted to "L" level.

Next, at t7, the memory controller 10 shifts the command latch enable signal CLE of the flash memory 20 from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, a command to instruct to read data from the sense amplifier module 27 to the memory controller 10 is transmitted to the flash memory 20 using the data signal DQ. The command to instruct to read data from the sense amplifier module 27 to the memory controller 10 is, for example, E0 h. After transmitting the command to instruct to read data from the sense amplifier module 27 to the memory controller 10, the command latch enable signal is deasserted to "L" level. Hereinabove, the issuance of the read data transmission command set is completed.

Next, at t8, the memory controller 10 toggles the read enable signal REn. As a result, data can be transmitted from the flash memory 20 to the memory controller 10. The data strobe signal DQS is toggled based on the toggled read enable signal REn. The memory controller 10 takes in data from the data signal DQ at a timing corresponding to the data strobe signal DQS.

Once the intake of data in the memory controller 10 is completed, the read operation in the memory system 1 according to the embodiment is completed.

1.2.2. Write Operation

The write operation of the memory system 1 according to the embodiment will be described with reference to FIGS. 7 and 8.

Figure 7:
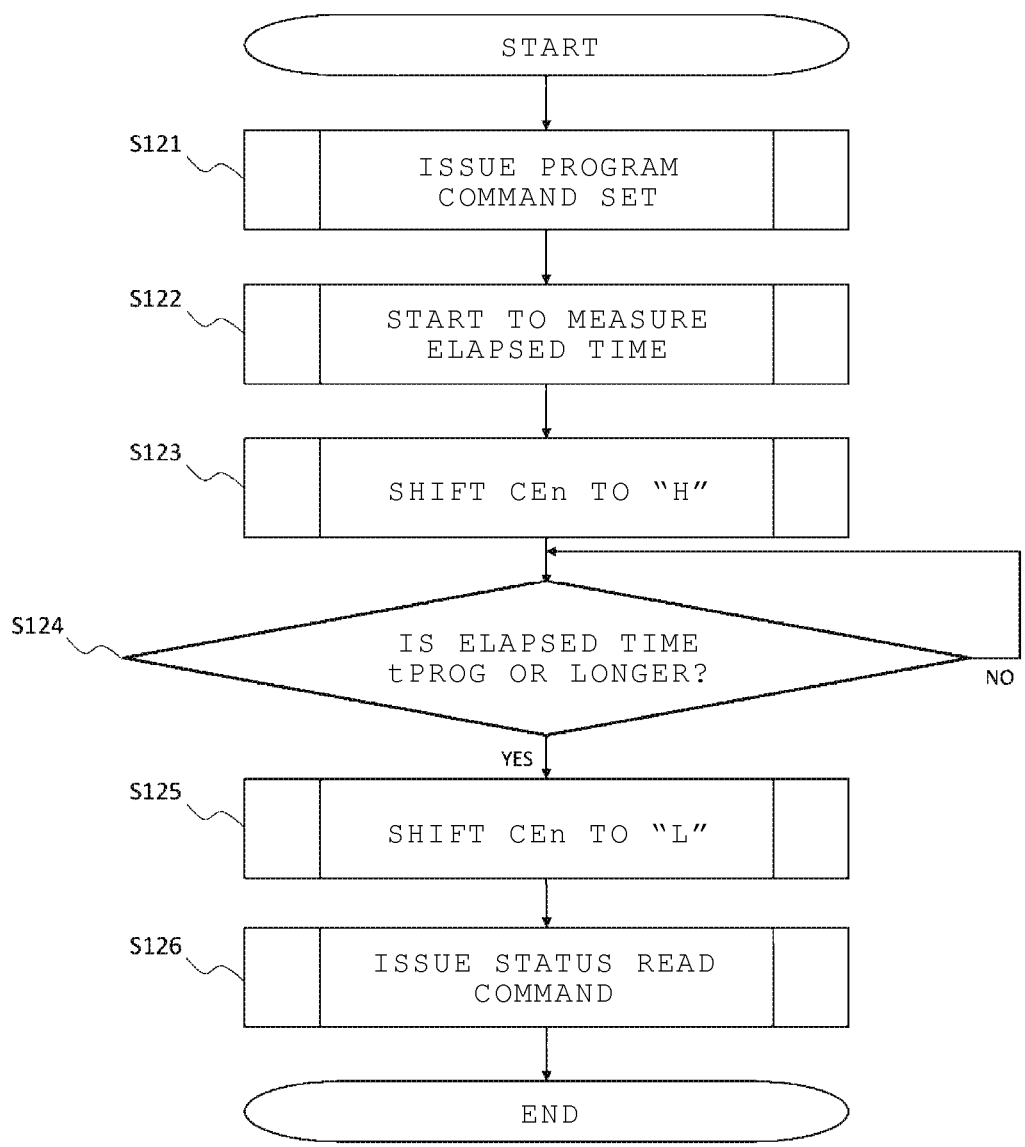
FIG. 7 is a flowchart illustrating an example of a write operation process of the memory controller in the memory system according to the first embodiment.

FIG. 7 is a flowchart illustrating an example of a write operation process of the memory controller in the memory system according to the first embodiment.

When the memory system 1 is powered on, the memory controller 10 loads the busy table T1 from the system area 31 of the flash memory 20 into the RAM 12 (busy table T1'). In the embodiment, an example where the busy table T1 is loaded into the RAM 12 when the memory system 1 is powered on is described. However, a timing at which the busy table T1 is loaded into the RAM 12 is not limited to this example.

When a data write command is received from the host apparatus 2, the memory controller 10 issues a program command set to the flash memory 20 (S121). In the embodiment, the program command set is a set including a command and an address relating to an operation of writing data into the memory cell array 28. The flash memory 20 starts the operation of writing data into the memory cell array 28 when the program command set is received.

When the operation of writing data into the memory cell array 28 starts, the flash memory 20 shifts the ready/busy signal R/Bn to the busy state. When the ready/busy signal R/Bn is shifted to the busy state, the memory controller 10 starts to measure elapsed time in the write operation using the timer 13 (S122).

When the memory controller 10 starts to measure the elapsed time in the write operation, the memory controller 10 shifts the chip enable signal CEn to "H" level (S123). That is, the memory controller 10 deasserts the chip enable signal CEn.

The memory controller 10 determines whether or not the elapsed time measured by the timer 13 is longer than or equal to the busy time tPROG stored in the busy table T1' (S124). When the memory controller 10 determines that the elapsed time is shorter than the busy time tPROG (S124; NO), the memory controller 10 repeats Step S124.

On the other hand, when the memory controller 10 determines that the elapsed time is longer than or equal to the busy time tPROG (S124; YES), the memory controller 10 shifts the chip enable signal CEn to "L" level (S125). That is, the memory controller 10 asserts the chip enable signal CEn.

When the operation of writing data into the memory cell array 28 is completed, the flash memory 20 shifts the ready/busy signal R/Bn to the ready state. When the memory controller 10 confirms that the ready/busy signal R/Bn is in the ready state, the memory controller 10 issues a status read command to the flash memory 20 (S126). The memory controller 10 receives success or failure of the operation of writing data into the memory cell array 28 from the flash memory 20. Hereinabove, the write operation is completed.

Figure 8:
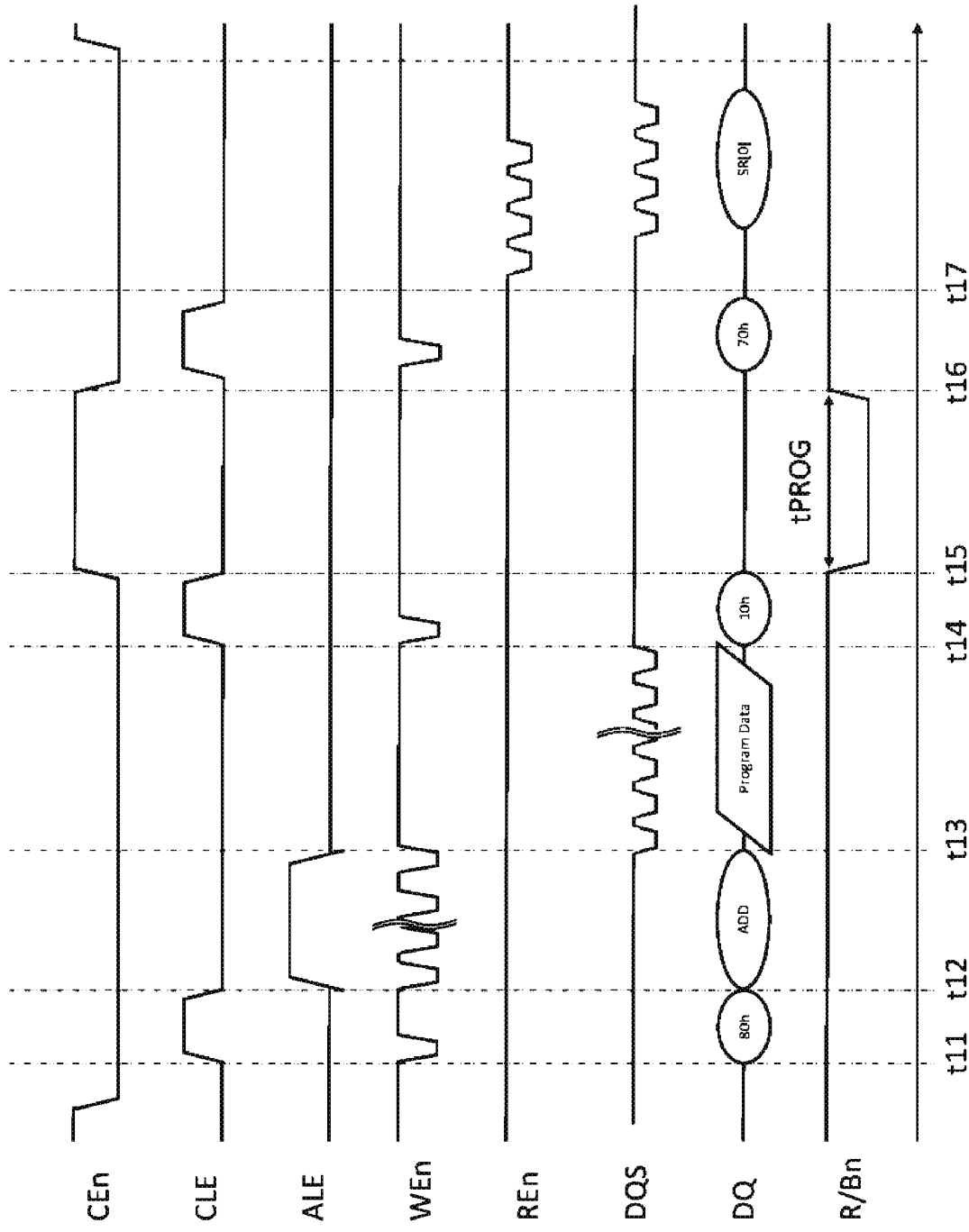
FIG. 8 is a timing chart illustrating an example of the write operation in the memory system according to the first embodiment.

FIG. 8 is a timing chart illustrating an example of the write operation in the memory system according to the first embodiment. The shift of the control signal in the write operation illustrated in FIG. 7 will be described using FIG. 8.

First, the memory controller 10 shifts the chip enable signal CEn from "H" level to "L" level. As a result, the chip enable signal CEn is asserted, and the memory controller 10 can get access to the flash memory 20.

Next, at t11, the memory controller 10 shifts the command latch enable signal CLE from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, a command to instruct to input a data write destination address is transmitted to the flash memory 20 using the data signal DQ. The command to instruct to input a data write destination address is, for example, 80 h. After transmitting the command to instruct to input the data write destination address, the command latch enable signal is deasserted to "L" level.

Next, at t12, the memory controller 10 shifts the address latch enable signal ALE from "L" level to "H" level. As a result, the address latch enable signal ALE is asserted. The memory controller 10 toggles the write enable signal WEn. As a result, the data write destination address can be transmitted from the memory controller 10 to the flash memory 20. At a timing corresponding to the write enable signal WEn, the memory controller 10 transmits the data write destination address to the flash memory 20 using the data signal DQ. After transmitting all the write destination addresses, the address latch enable signal ALE is deasserted to "L" level.

Next, at t13, the memory controller 10 toggles the data strobe signal DQS. As a result, data can be transmitted from the memory controller 10 to the sense amplifier module 27. The memory controller 10 transmits write data to the data signal DQ at the timing corresponding to the data strobe signal DQS.

Next, at t14, the memory controller 10 shifts the command latch enable signal CLE from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, a command to instruct to write data from the sense amplifier module 27 into the memory cell array 28 designated by the write destination address is transmitted to the flash memory 20 using the data signal DQ. The command to instruct to write data from the sense amplifier module 27 into the memory cell array 28 designated by the write destination address is, for example, 10 h. After transmitting the command to instruct to write data from the sense amplifier module 27 into the memory cell array 28 designated by the write destination address, the command latch enable signal is deasserted to "L" level. Hereinabove, the issuance of the program command set is completed.

At t15, the flash memory 20 shifts the ready/busy signal R/Bn from "H" level to "L" level. As a result, the ready/busy signal R/Bn enters "the busy state", and the operation of writing data into the memory cell array 28 is executed.

While the ready/busy signal R/Bn is in the busy state ("L" level), that is, during the busy time tPROG in the write operation, the memory controller 10 shifts the chip enable signal CEn from "L" level to "H" level. As a result, the chip enable signal CEn is deasserted.

At t16 after the busy time tPROG in the write operation is elapsed, the chip enable signal CEn is shifted from "H" level to "L" level. As a result, the chip enable signal CEn is asserted.

In addition, after the operation of writing data into the memory cell array 28 is completed, the flash memory 20 shifts the ready/busy signal R/Bn from "L" level to "H" level. As a result, the ready/busy signal R/Bn enters "the ready state".

Further, at t16, the memory controller 10 shifts the command latch enable signal CLE of the flash memory 20 from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, the status read command is transmitted to the flash memory using the data signal DQ. The status read command is, for example, 70 h. After transmitting the status read command, the command latch enable signal is deasserted to "L" level.

Next, at t17, the memory controller 10 toggles the read enable signal REn. As a result, data can be transmitted from the flash memory 20 to the memory controller 10. The data strobe signal DQS is toggled based on the toggled read enable signal REn. The memory controller 10 takes in data from the data signal DQ at the timing corresponding to the data strobe signal DQS. For example, when the taken data is 0, the operation of writing data into the memory cell array 28 is succeeded, and when the taken data is 1, the operation of writing data into the memory cell array 28 is failed.

When the memory controller 10 confirms the success or failure of the operation of writing data into the memory cell array 28, the write operation in the memory system 1 according to the embodiment is completed.

1.2.3. Erasing Operation

The erasing operation of the memory system 1 according to the embodiment will be described with reference to FIGS. 9 and 10.

Figure 9:
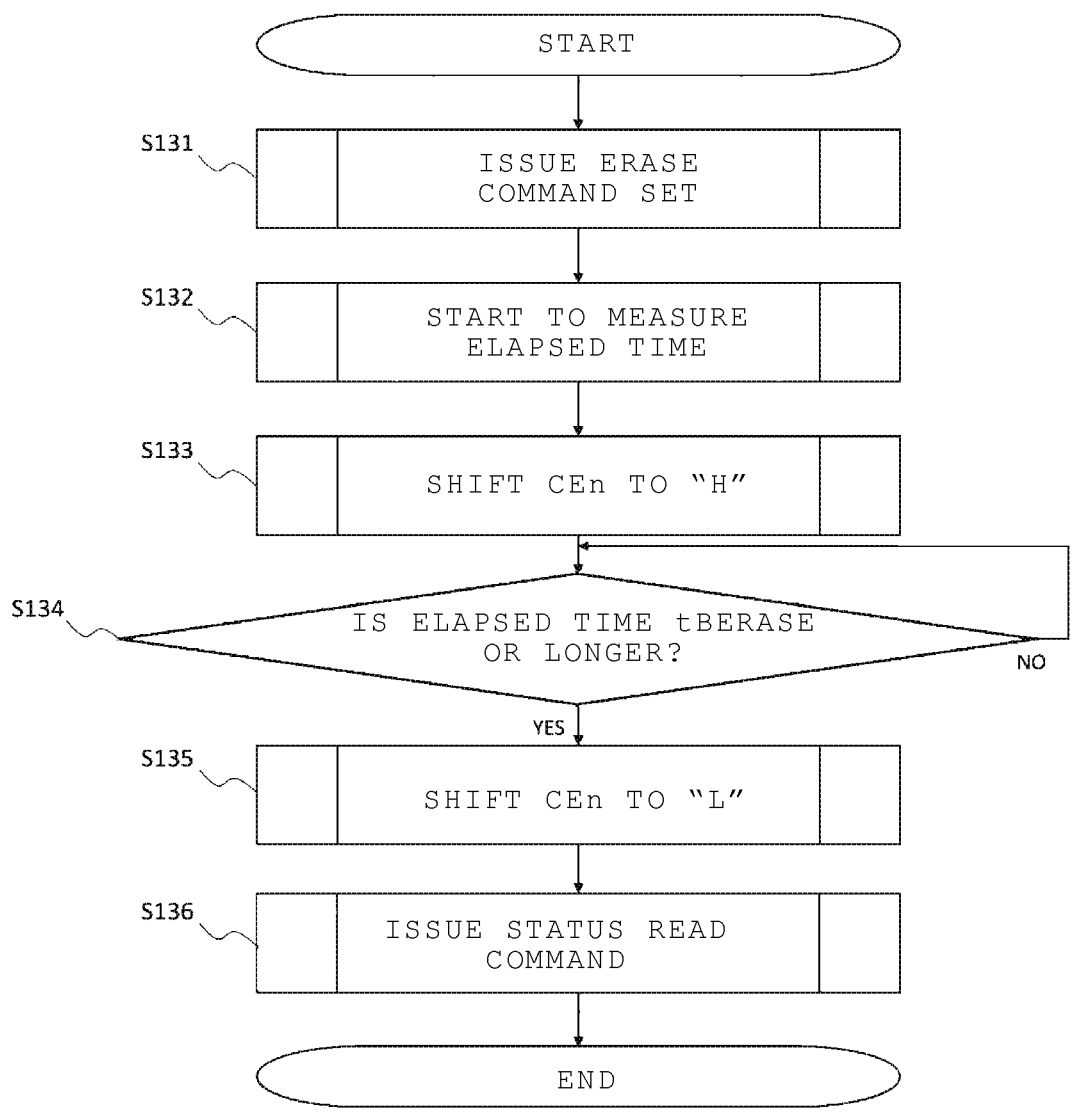
FIG. 9 is a flowchart illustrating an example of an erasing operation process of the memory controller in the memory system according to the first embodiment.

FIG. 9 is a flowchart illustrating an example of a process of the memory controller in the erasing operation of the memory system according to the first embodiment.

When the memory system 1 is powered on, the memory controller 10 loads the busy table T1 from the system area 31 of the flash memory 20 into the RAM 12 (busy table T1'). In the embodiment, an example where the busy table T1 is loaded into the RAM 12 when the memory system 1 is powered on is described. However, a timing at which the busy table T1 is loaded into the RAM 12 is not limited to this example.

When a block erase command is received from the host apparatus 2, the memory controller 10 issues an erase command set to the flash memory 20 (S131). In the embodiment, the erase command set is a set including a command and an address relating to an operation of erasing data of the memory cell array 28. When the erase command set is received, the flash memory 20 starts the operation of erasing data of the memory cell array 28.

When the operation of erasing data of the memory cell array 28 starts, the flash memory 20 shifts the ready/busy signal R/Bn to the busy state. When the ready/busy signal R/Bn is shifted to the busy state, the memory controller 10 starts to measure elapsed time in the erasing operation using the timer 13 (S132).

When the memory controller 10 starts to measure the elapsed time in the erasing operation, the memory controller 10 shifts the chip enable signal CEn to "H" level (S133). That is, the memory controller 10 deasserts the chip enable signal CEn.

The memory controller 10 determines whether or not the elapsed time measured by the timer 13 is longer than or equal to the busy time tBERASE stored in the busy table T1' (S134). When the memory controller 10 determines that the elapsed time is shorter than the busy time tBERASE (S134; NO), the memory controller 10 repeats Step S134.

On the other hand, when the memory controller 10 determines that the elapsed time is longer than or equal to the busy time tBERASE (S134; YES), the memory controller 10 shifts the chip enable signal CEn to "L" level (S135). That is, the memory controller 10 asserts the chip enable signal CEn.

When the operation of erasing data of the memory cell array 28 is completed, the flash memory 20 shifts the ready/busy signal R/Bn to the ready state. When the memory controller 10 confirms that the ready/busy signal R/Bn is in the ready state, the memory controller 10 issues a status read command to the flash memory 20 (S136). The memory controller 10 receives success or failure of the operation of erasing data of the memory cell array 28 from the flash memory 20. Hereinabove, the erasing operation is completed.

Figure 10:
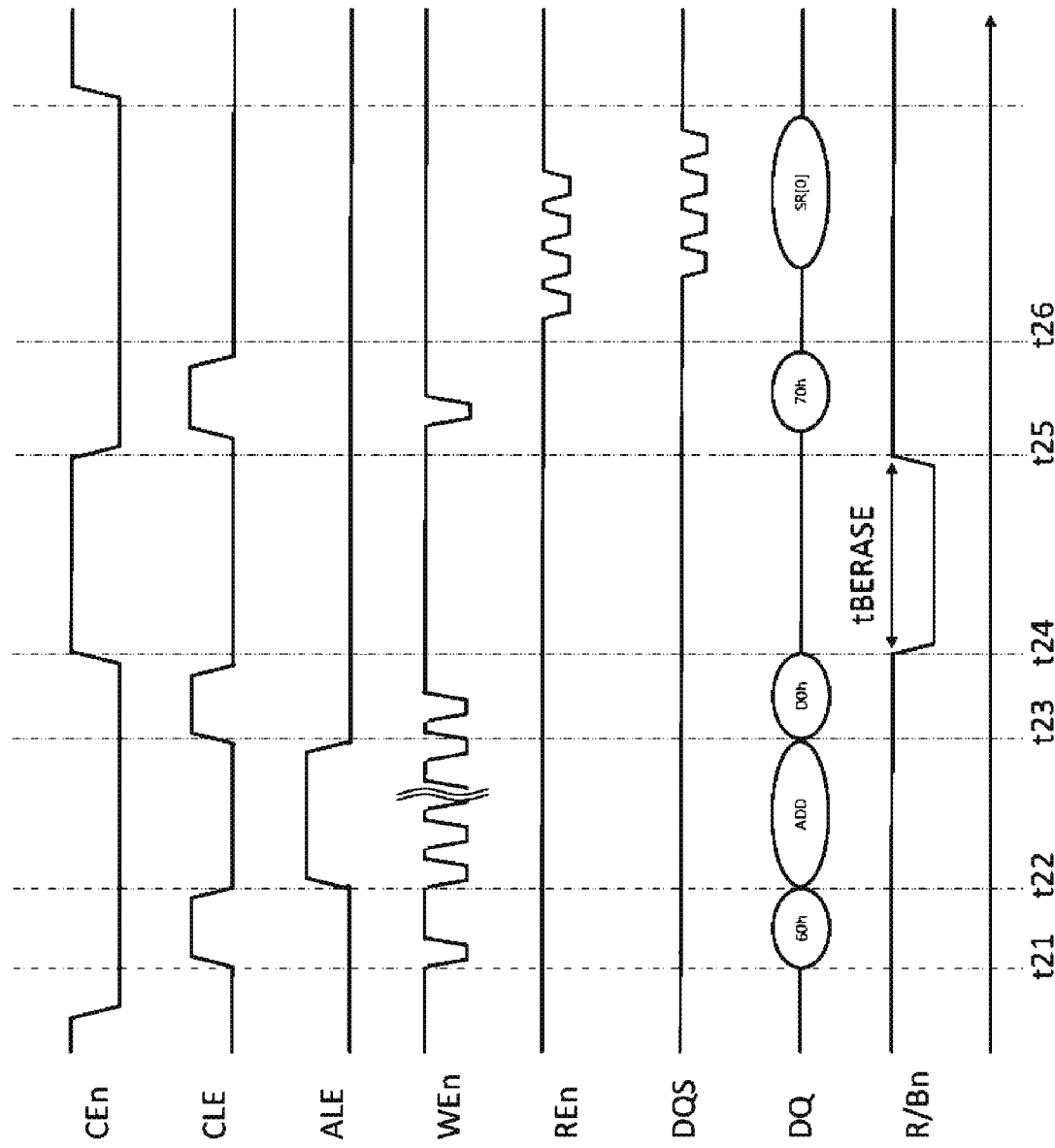
FIG. 10 is a timing chart illustrating an example of the erasing operation in the memory system according to the first embodiment.

FIG. 10 is a timing chart illustrating an example of the erasing operation in the memory system according to the first embodiment. The shift of the control signal in the erasing operation illustrated in FIG. 9 will be described using FIG. 10.

First, the memory controller 10 shifts the chip enable signal CEn from "H" level to "L" level. As a result, the chip enable signal CEn is asserted, and the memory controller 10 can get access to the flash memory 20.

Next, at t21, the memory controller 10 shifts the command latch enable signal CLE from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, a command to instruct to input an address of a data erase destination block is transmitted to the flash memory 20 using the data signal DQ. The command to instruct to input the address of the data erase destination block is, for example, 60 h. After transmitting the command to instruct to input the address of the data erase destination block, the command latch enable signal is deasserted to "L" level.

Next, at t22, the memory controller 10 shifts the address latch enable signal ALE from "L" level to "H" level. As a result, the address latch enable signal ALE is asserted. The memory controller 10 toggles the write enable signal WEn. As a result, the address of the data erase destination block can be transmitted from the memory controller 10 to the flash memory 20. At the timing corresponding to the write enable signal WEn, the memory controller 10 transmits the address of the data erase destination block to the flash memory 20 using the data signal DQ. After transmitting all the addresses of the data erase destination blocks, the address latch enable signal ALE is deasserted to "L" level.

Next, at t23, the memory controller 10 shifts the command latch enable signal CLE from "L" level to "H" level, and shifts the write enable signal WEn from "H" level to "L" level. As a result, the command latch enable signal CLE and the write enable signal WEn are asserted. The memory controller 10 shifts the write enable signal WEn from "L" level to "H" level. In parallel to this operation, a command to instruct to erase data is transmitted to the flash memory 20 using the data signal DQ. The command to instruct to erase data is, for example, D0 h. After transmitting the command to instruct to erase data, the command latch enable signal is deasserted to "L" level. Hereinabove, the issuance of the erase command set is completed.

At t24, the flash memory 20 shifts the ready/busy signal R/Bn from "H" level to "L" level. As a result, the ready/busy signal R/Bn enters "the busy state", and the operation of erasing data of the memory cell array 28 is executed.

While the ready/busy signal R/Bn is in the busy state ("L" level), that is, during the busy time tBERASE in the erasing operation, the memory controller 10 shifts the chip enable signal CEn from "L" level to "H" level. As a result, the chip enable signal CEn is deasserted.

At t25 after the busy time tBERASE in the erasing operation is elapsed, the memory controller 10 shifts the chip enable signal CEn from "H" level to "L" level. As a result, the chip enable signal CEn is asserted.

In addition, after the operation of erasing data of the memory cell array 28 is completed, the flash memory 20 shifts the ready/busy signal R/Bn from "L" level to "H" level. As a result, the ready/busy signal R/Bn enters "the ready state".

Further, at t25, the memory controller 10 shifts the command latch enable signal CLE of the flash memory 20 from "L" level to "H" level, and shifts the write enable signal WEn from "H" level to "L" level. As a result, the command latch enable signal CLE and the write enable signal WEn are asserted. The controller 10 shifts the write enable signal WEn from "L" level to "H" level. In parallel to this operation, the status read command is transmitted to the flash memory 20 using the data signal DQ. After transmitting the status read command, the command latch enable signal is deasserted to "L" level.

Next, at t26, the memory controller 10 toggles the read enable signal REn. As a result, data can be transmitted from the flash memory 20 to the memory controller 10. The data strobe signal DQS is toggled based on the toggled read enable signal REn. The memory controller 10 takes in data from the data signal DQ at the timing corresponding to the data strobe signal DQS. For example, when the taken data is 0, the operation of erasing data of the memory cell array 28 is succeeded, and when the taken data is 1, the operation of erasing data of the memory cell array 28 is failed.

When the memory controller 10 confirms the success or failure of the operation of erasing data of the memory cell array 28, the erasing operation in the memory system according to the embodiment is completed.

1.3. Effect

As described above, in the embodiment, the memory controller 10 shifts the chip enable signal CEn to "H" level based on the busy time stored in the busy table T1' such that the power consumption can be reduced. Further, the memory controller 10 controls the chip enable signal CEn based on the busy time such that deterioration in the performance of the operation process can be prevented.

2. Second Embodiment

Next, a second embodiment will be described. The second embodiment is different from the first embodiment, in that a busy time stored in a busy table T2 loaded into the RAM 12 is based on a measured value. The configuration of the second embodiment other than the point that the busy time stored in the busy table T2 is based on the measured value is the same as that of the memory system according to the first embodiment. Therefore, the same components are represented by the same reference numerals, and the description thereof will not be repeated. In addition, changes in the various operations including the read operation, the write operation, and the erasing operation are the same. Therefore, the read operation will be described as an example, and detailed description of the other operations will not be repeated. In addition, for convenience of description, numerical values of the busy time required for various operation processes in the busy table T2 are described. However, these values are merely examples and can be freely changed.

2.1. Configuration and Operation

The memory system 1 according to the second embodiment will be described using FIGS. 11 and 12.

Figure 11:
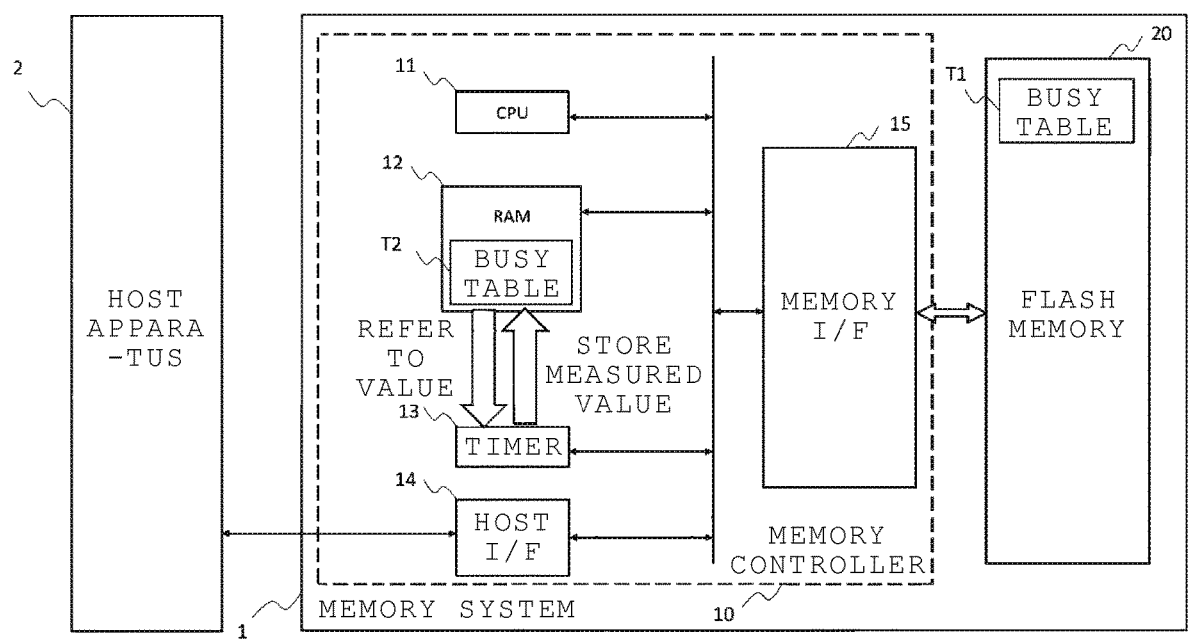
FIG. 11 is a diagram schematically illustrating an update operation performed on a busy table in a memory system according to a second embodiment.

FIG. 11 is a diagram schematically illustrating an update operation performed on the busy table in the memory system according to the second embodiment. As illustrated in FIG. 11, when the memory system 1 is powered on, the memory controller 10 loads the busy table T1 into the RAM 12 (busy table T1'). The memory controller 10 measures the busy time of the flash memory 20 using the timer 13 to update the busy table T1' to the busy table T2. A timing at which the busy table T1' is updated to the busy table T2 is not limited to the time of the power-on of the memory system 1. The memory controller 10 may measure the busy time of the flash memory 20 during an idle state using the timer 13 to update the busy table T1' to the busy table T2. In addition, the measured busy time of the flash memory 20 may be stored in the flash memory 20 as the busy table T2.

Figures 12, 13:
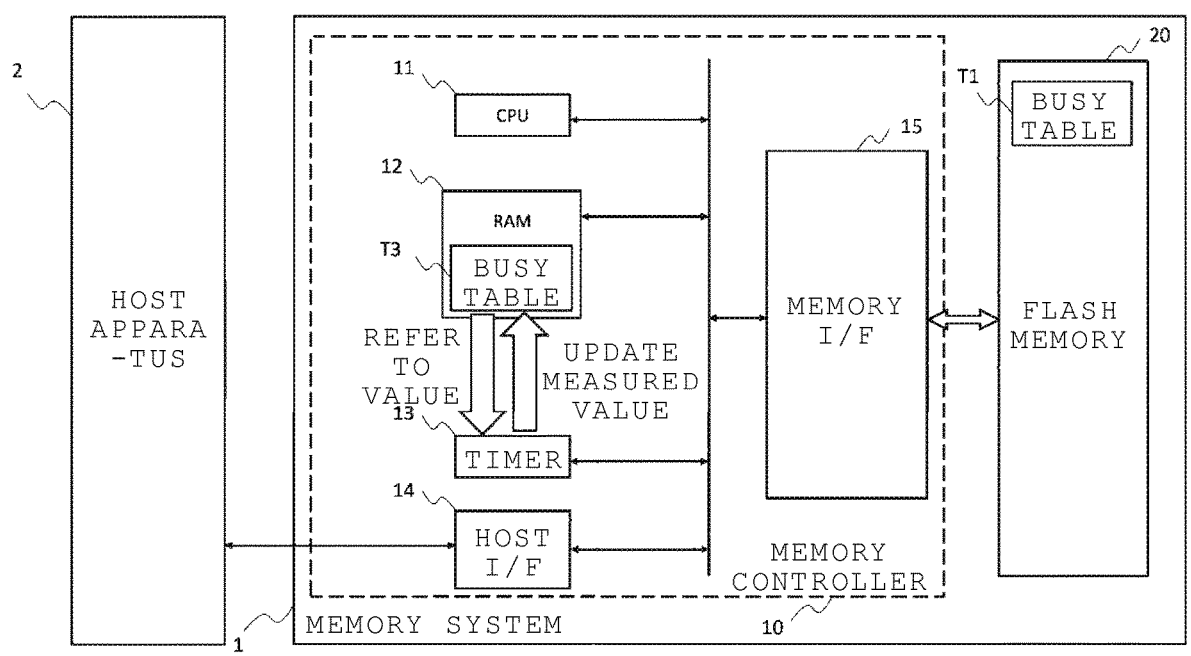
FIG. 12 is an example of a busy table containing lengths of various operation times of a nonvolatile memory in the memory system according to the second embodiment.
FIG. 13 is a diagram schematically illustrating an update operation performed on a busy table in a memory system according to a third embodiment.

FIG. 12 is the busy table T2 illustrating an example of values obtained by measuring an operation time of the nonvolatile memory in the memory system according to the second embodiment. As illustrated in FIG. 12, in the busy table T2, measured values of the busy time required for the various operation processes per a plurality of blocks BLK are stored. In the embodiment, the values of the busy time required for the operation processes per the plurality of blocks are described, but the present disclosure is not limited thereto. The busy time required for the operation processes per plane or per flash memory may be adopted. The busy time required for each of the operation processes per the plurality of blocks BLK is, for example, the average value of the busy time required for a plurality of pages in each of the blocks BLK. In the embodiment, the average value of the busy time required for a plurality of pages in each of the blocks BLK is used, but the present disclosure is not limited thereto. The maximum value or the minimum value of the busy time required for a plurality of pages in each of the blocks BLK may be adopted. Further, depending on the various operation processes, any value may be selected from the average value, the maximum value, and the minimum value of the busy time required for a plurality of pages in each of the blocks BLK.

2.2. Effect

As described above, the same effect as that of the first embodiment can also be obtained with the second embodiment. In addition, in the embodiment, by measuring the actual busy time in the flash memory 20 to be controlled, a variation per plane, per block, and per page of the flash memory 20 to be controlled can be considered. That is, a difference between the busy time stored in the busy table T2 and the busy time of the actual flash memory 20 to be controlled is reduced. Therefore, as compared to the first embodiment, the power consumption can be reduced with high accuracy, and deterioration in the performance of the operation process can be further prevented.

Further, when the maximum value of the busy time measured in the flash memory 20 to be controlled is used, the number of times the status read command is issued can be reduced, and the power consumption can be further reduced.

In addition, when the minimum value of the busy time measured in the flash memory 20 to be controlled is used, the length of time in which the flash memory 20 waits in the ready state can be reduced, and deterioration in the performance of the operation process can be further prevented.

3. Third Embodiment

Next, a third embodiment will be described. The third embodiment is different from the first embodiment, in that the busy time stored in a busy table T1' loaded into the RAM 12 is updated. The configuration of the third embodiment other than the point that the busy time stored in the busy table T1' is updated is the same as that of the memory system according to the first embodiment. Therefore, the same components are represented by the same reference numerals, and the description thereof will not be repeated. In addition, changes in the various operations including the read operation, the write operation, and the erase operation are the same. Therefore, the read operation will be described as an example, and detailed description of the other operations will not be repeated.

3.1. Configuration and Operation

The memory system according to the third embodiment will be described using FIGS. 13 and 14.

FIG. 13 is a diagram schematically illustrating an update operation performed on the busy table in the memory system according to the third embodiment. The timer 13 measures the elapsed time from a start of an operation with reference to the busy time stored in the busy table T1' (not illustrated; only an updated busy table T3 is described; the update operation will be described below) loaded into the RAM 12. The memory controller 10 checks the ready/busy signal R/Bn when the measured elapsed time is equal to the busy time stored in the busy table T1', and updates the busy table T1' in accordance with the state of the ready/busy signal R/Bn (busy table T3). The number of times of update may be any value. When the ready/busy signal R/Bn is in the busy state, the memory controller 10 increases the value of the busy time stored in the busy table T1'. In addition, when the ready/busy signal R/Bn is in the ready state, the memory controller 10 decreases the value of the busy time stored in the busy table T1'. The amount of increase or decrease in the value of the busy time stored in the busy table T1' may be based on a measured value or a predetermined value.

Figure 14:
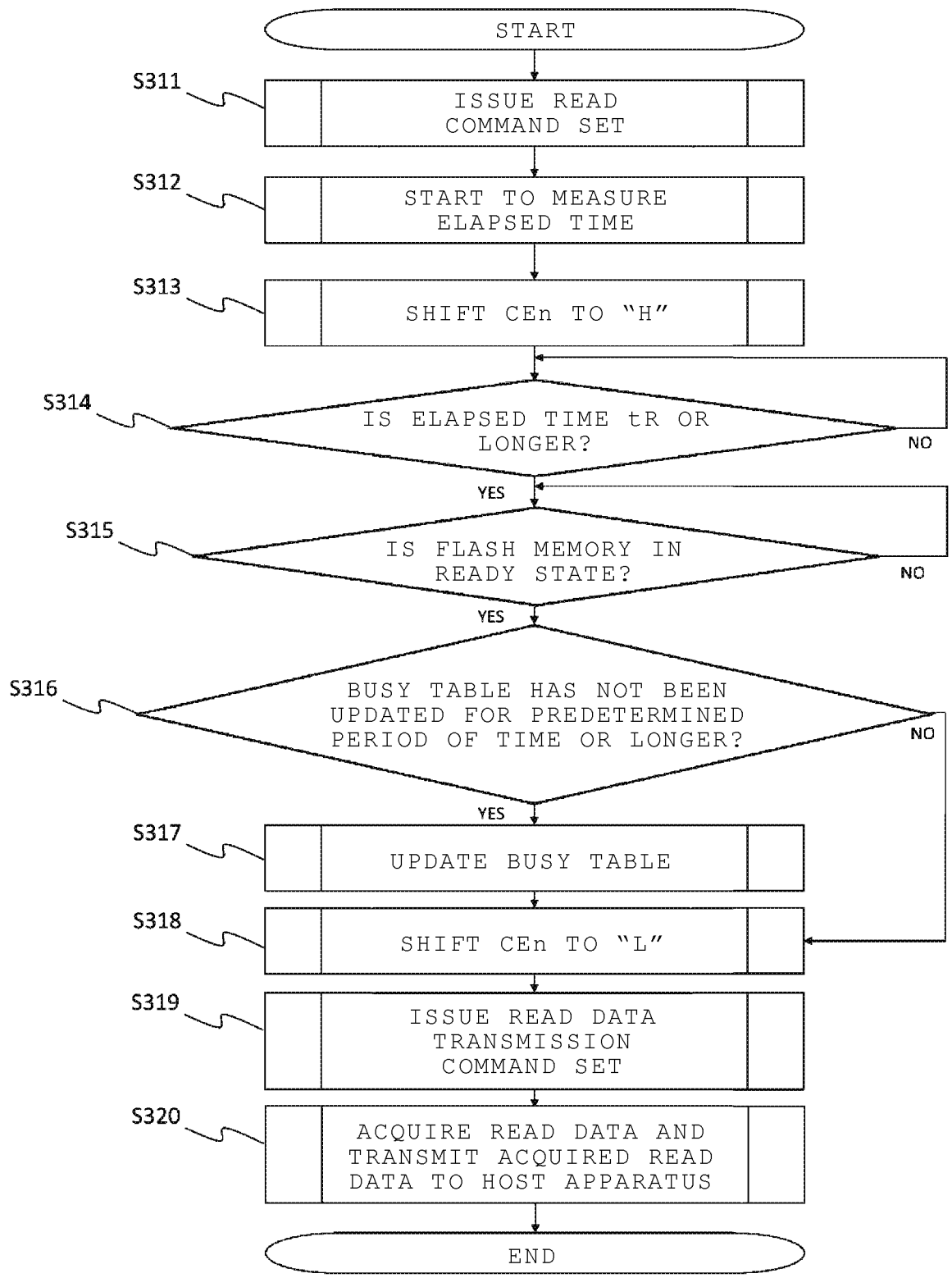
FIG. 14 is a timing chart illustrating an example of the update operation process performed on the busy table during a read operation of the memory controller in the memory system according to the third embodiment.

FIG. 14 is a timing chart illustrating an example of the update operation performed on the busy table in the read operation of the memory controller in the memory system according to the third embodiment. The update operation from the busy table T1' to the busy table T3 described in FIG. 13 will be described in detail using FIG. 14.

When the memory system 1 is powered on, the memory controller 10 loads the busy table T1 stored in the flash memory 20 from the system area 31 of the flash memory 20 into the RAM 12 (busy table T1'). In the embodiment, an example where the busy table T1' is loaded into the RAM 12 when the memory system 1 is powered on is described. However, a timing at which the busy table T1 is loaded into the RAM 12 is not limited to this example.

When a data read command is received from the host apparatus 2, the memory controller 10 issues a read command set to the flash memory 20 (S311). When the flash memory 20 receives the read command set, the sense amplifier module 27 starts the operation of reading data stored in the memory cell array 28.

After the sense amplifier module 27 starts the operation of reading data stored in the memory cell array 28, when the ready/busy signal R/Bn is shifted to the busy state, the memory controller 10 starts to measure elapsed time in the read operation described using the timer 13 (S312).

When the memory controller 10 starts to measure the elapsed time in the read operation, the memory controller 10 shifts the chip enable signal CEn to "H" level (S313). That is, the memory controller 10 deasserts the chip enable signal CEn.

The memory controller 10 determines whether or not the elapsed time measured by the timer 13 is longer than or equal to the busy time tR stored in the busy table T1' (S314). When the memory controller 10 determines that the elapsed time is shorter than the busy time tR (S314; NO), the memory controller 10 repeats Step S314.

On the other hand, when the memory controller 10 determines that the elapsed time is longer than or equal to the busy time tR (S314; YES), the memory controller 10 checks the ready/busy signal R/Bn to determine whether or not the flash memory 20 is in the ready state (S315). When the flash memory 20 is in the busy state (S315; NO), Step S315 is repeated.

On the other hand, when the flash memory 20 is in the ready state (S315; YES), it is determined whether or not the busy table T1' has not been updated for a predetermined period of time or longer (S316).

When the busy table T1' has not been updated for the predetermined period of time or longer (S316; YES), the busy time tR stored in the busy table T1' is updated based on the elapsed time measured by the timer 13 (S317). If Step S315 is repeated, this means that the busy time tR stored in the busy table T1' is shorter than the actual busy time elapsed during the read operation of the flash memory 20. Therefore, the value of the busy time tR stored in the busy table T1' is increased in accordance with the actual busy time elapsed during the read operation of the flash memory 20.

On the other hand, when the ready/busy signal R/Bn is already in the ready state during the check in step S315, that is, when the memory controller 10 proceeds to Step S316 without repeating Step S315, the busy time tR stored in the busy table T1' is longer than the actual busy time elapsed during the read operation of the flash memory 20. Therefore, the value of the busy time tR stored in the busy table T1' is decreased in accordance with the actual busy time elapsed during the read operation of the flash memory 20.

After updating the busy time tR stored in the busy table T3, the memory controller 10 shifts the chip enable signal CEn to "L" level (S318). In addition, in Step S316, it is determined that the busy table T3 has been updated at a time earlier than the predetermined period of time (S316; NO), the memory controller 10 shifts the chip enable signal CEn to "L" level (S318).

In the description of the embodiment, after updating the busy time tR stored in the busy table T3, the memory controller 10 shifts the chip enable signal CEn to "L" level. However, the memory controller 10 shifts the chip enable signal CEn to "L" level during the update. Alternatively, the memory controller 10 may update the busy time tR stored in the busy table T1' after shifting the chip enable signal CEn to "L" level. Further, the memory controller 10 shifts the chip enable signal CEn to "L" level after determining whether or not the busy table has not been updated for the predetermined period of time. However, the memory controller 10 may shift the chip enable signal CEn to "L" level before determining whether or not the state where the busy table has not been updated for the predetermined period of time. Then, in Step S316, when it is determined that the busy table T3 has been updated at a time earlier than the predetermined period of time (S316; NO), the memory controller 10 proceeds to Step S319.

Next, the memory controller 10 issues the read data transmission command set to the flash memory 20 (S319). The memory controller 10 acquires the read data from the flash memory 20 through the operation of transmitting the data read to the sense amplifier module 27 to the memory controller 10. The memory controller 10 transmits the read data to the host apparatus 2 via the host I/F 14 (S320). Hereinabove, the read operation is completed. In addition, the update from the busy table T1' to the busy table T3 is completed.

3.2. Effect

As described above, the same effect as that of the first embodiment can also be obtained with the third embodiment. In addition, in the embodiment, the busy time stored in the busy table T1' is updated regularly such that the chip enable signal CEn can be controlled based on the constantly optimum busy time. Accordingly, as compared to the first embodiment, the power consumption can be reduced with high accuracy over a long period of time, and deterioration in the performance of the operation process can be further prevented.

4. Fourth Embodiment

Next, a fourth embodiment will be described. The fourth embodiment is different from the first embodiment, in that a nonvolatile memory package including a plurality of nonvolatile memories is provided. The configuration of the fourth embodiment other than the point that the nonvolatile memory package including a plurality of nonvolatile memories is provided is the same as that of the memory system according to the first embodiment. Therefore, the same components are represented by the same reference numerals, and the description thereof will not be repeated.

4.1. Configuration and Operation

A configuration of the memory system 1 according to the fourth embodiment will be described using FIGS. 15 to 17.

Figure 15:
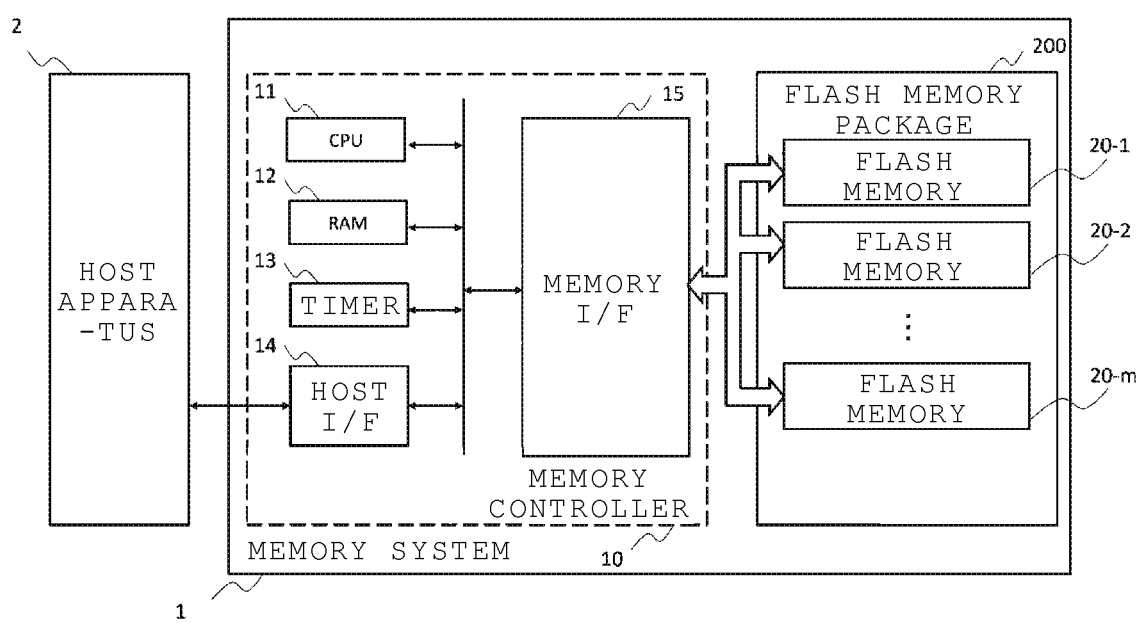
FIG. 15 is a block diagram illustrating an example of a configuration of a memory system according to a fourth embodiment.

FIG. 15 is a block diagram illustrating an example of the configuration of the memory system according to the fourth embodiment. As illustrated in FIG. 15, the memory system 1 includes a flash memory package 200 and the memory controller 10 and is controlled by the host apparatus 2. The flash memory package 200 is an example of the nonvolatile memory package. In addition, the flash memory package 200 includes a plurality of flash memories 20-1 to 20-$m$ ($m$ represents an integer of 2 or more). The memory controller 10 can control the plurality of flash memories 20-1 to 20-$m$.

Figure 16:
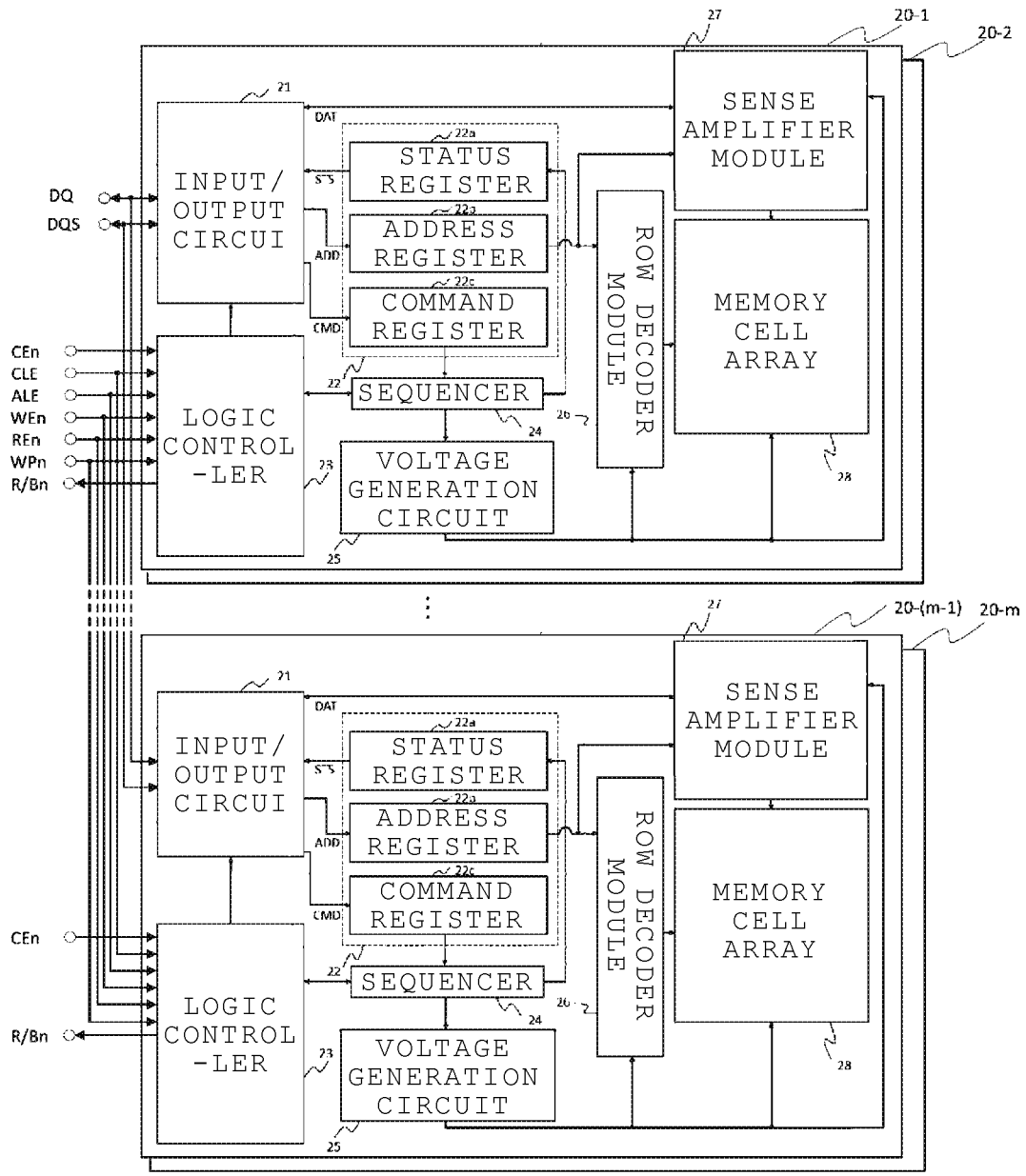
FIG. 16 is a block diagram illustrating an example of a configuration of a nonvolatile memory package in the memory system according to the fourth embodiment.

FIG. 16 is a block diagram illustrating an example of the configuration of the nonvolatile memory package in the memory system according to the fourth embodiment. As illustrated in FIG. 16, the plurality of flash memories 20-1 to 20-$m$ share the data signal DQ, the data strobe signal DQS and some control signals. The shared control signals include, for example, the command latch enable signal CLE, the address latch enable signal ALE, the write enable signal WEn, the read enable signal REn, and the write-protect signal WPn. In addition, in the plurality of flash memories 20-1 to 20-$m$, for example, every two flash memories 20 share the ready/busy signal R/Bn. That is, in the description of the embodiment, the flash memory 20-1 and the flash memory 20-2 share the ready/busy signal R/Bn. The number of flash memories that share the ready/busy signal R/Bn is not limited to two. Further, each of the plurality of flash memories 20-1 to 20-$m$ includes, for example, the chip enable signal CEn.

Figure 17:
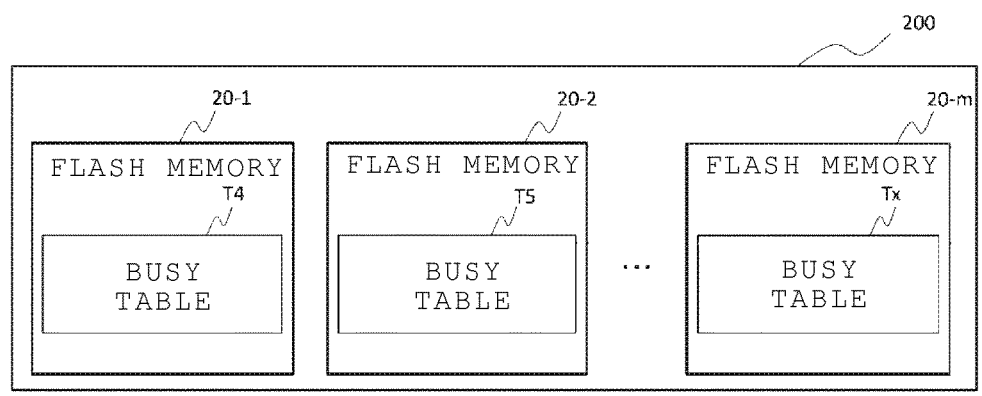
FIG. 17 is a diagram illustrating an example of a configuration of busy tables in a plurality of nonvolatile memories in the memory system according to the fourth embodiment.

FIG. 17 is a diagram illustrating an example of a configuration of busy tables in the plurality of nonvolatile memories in the memory system according to the fourth embodiment.

As illustrated in FIG. 17, the plurality of flash memories 20-1 to 20-$m$ store busy tables T4 to Tx, respectively. That is, the flash memory 20-1 stores the busy table T4. The flash memory 20-2 stores the busy table T5. The flash memory 20-$m$ stores the busy table Tx. The memory controller 10 loads any one of the busy tables T4 to Tx into the RAM 12 from the flash memory 20 to be controlled among the plurality of flash memories 20-1 to 20-$m$. The memory controller 10 controls the chip enable signal CEn based on the busy time stored in any one of the loaded busy tables T4' to Tx' (not illustrated). In the embodiment, for example, when the flash memory 20 to be controlled is the flash memory 20-1, the memory controller 10 loads the busy table T4 into the RAM 12 from the flash memory 20-1. The memory controller 10 controls the chip enable signal CEn based on the busy time stored in the loaded busy table T4'. Each of the busy tables T4 to Tx stores the busy time based on the measured value of the busy time in each of a plurality of pages of the plurality of flash memories 20.

Each of the busy tables T4 to Tx may store, for example, the average value, the maximum value, or the minimum value of the measured value of the busy time in each of the plurality of pages of the plurality of flash memories 20. In addition, each of the busy tables T4 to Tx may store, for example, the average value, the maximum value, and the minimum value of the measured value of the busy time in each of the plurality of pages of the plurality of flash memories 20, and may control the chip enable signal CEn by selecting any one of the average value, the maximum value, and the minimum value of the measured values of the busy time in the plurality of pages of the flash memory 20 to be controlled depending on various operation processes.

4.2. Effect

As described above, the same effect as that of the first embodiment can also be obtained with the fourth embodiment. In addition, in the embodiment, when the nonvolatile memory package including a plurality of nonvolatile memories is provided, the power consumption can be appropriately reduced in consideration of the circumstances of each of the plurality of nonvolatile memories.

5. Fifth Embodiment

Next, a fifth embodiment will be described. The fifth embodiment is different from the fourth embodiment, in that a plurality of nonvolatile memory packages are provided. The configuration of the fifth embodiment other than the point that the plurality of nonvolatile memory packages are provided is the same as that of the memory system according to the fourth embodiment. Therefore, the same components are represented by the same reference numerals, and the description thereof will not be repeated.

5.1. Configuration and Operation

A configuration of the memory system according to the fifth embodiment will be described using FIGS. 18 and 19.

Figure 18:
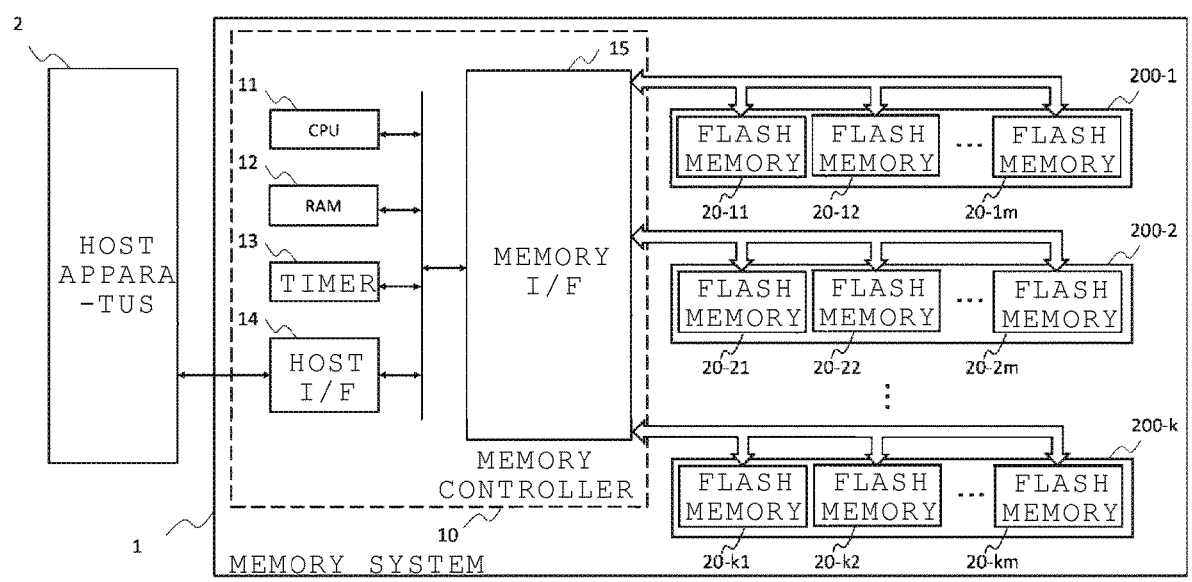
FIG. 18 is a block diagram illustrating an example of a configuration of a memory system according to a fifth embodiment.

FIG. 18 is a block diagram illustrating an example of the configuration of the memory system according to the fifth embodiment. As illustrated in FIG. 18, the memory system 1 includes a plurality of flash memory packages 200-1 to 200-$k$ ($k$ represents an integer of 2 or more) and the memory controller 10 and is controlled by the host apparatus 2.

Figure 19:
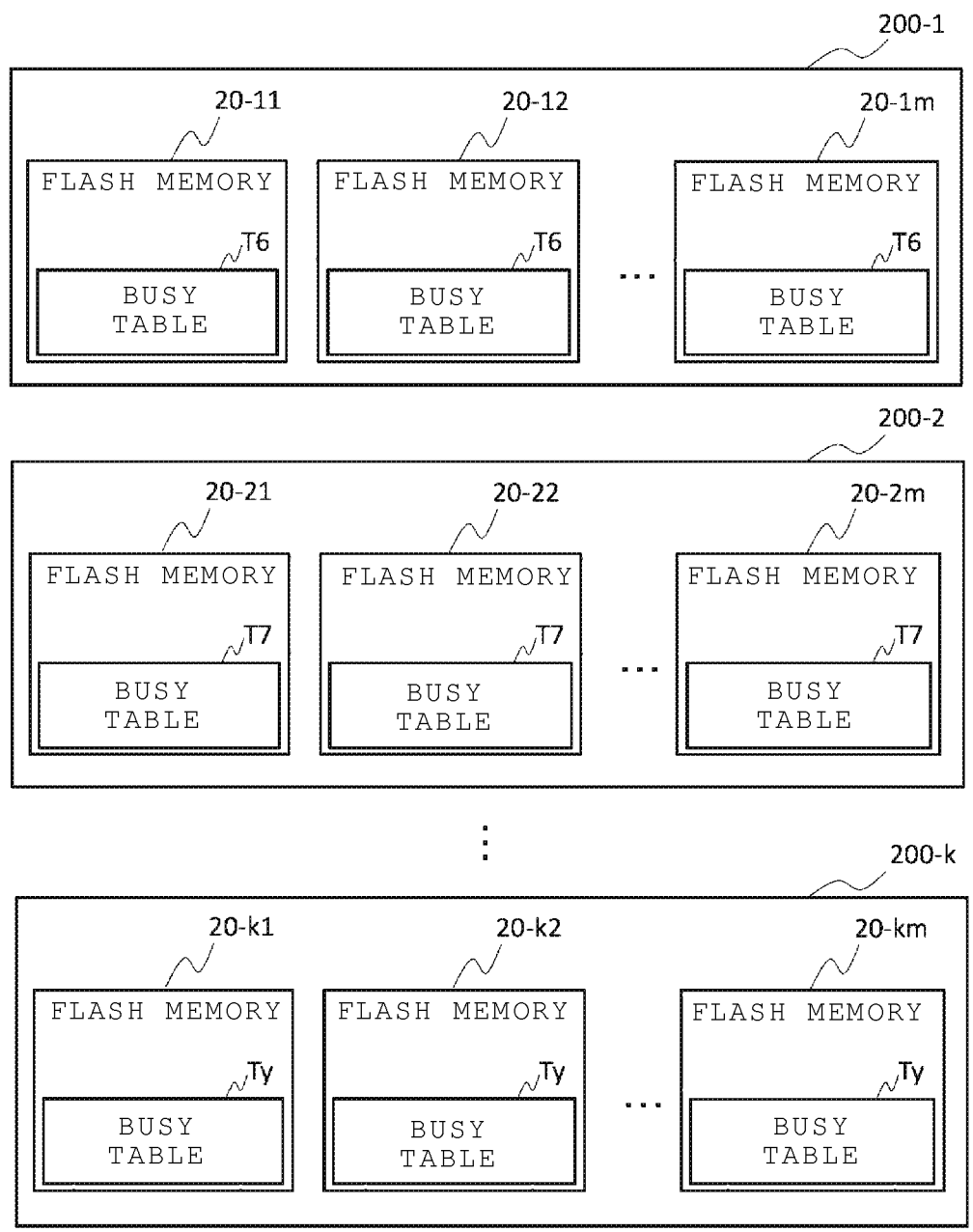
FIG. 19 is a diagram illustrating an example of a configuration of busy tables in a plurality of nonvolatile memories in the memory system according to the fifth embodiment.

FIG. 19 is a diagram illustrating an example of busy tables in the plurality of nonvolatile memories in the memory system according to the fifth embodiment.

As illustrated in FIG. 19, a plurality of flash memories 20-11 to 20-$km$ in each of the plurality of flash memory packages 200-1 to 200-$k$ store busy tables T6 to Ty common to the plurality of flash memory packages 200, respectively. That is, the plurality of flash memories 20-11 to 20-1$m$ in the flash memory package 200-1 store the busy table T6. A plurality of flash memories 20-21 to 20-2$m$ in the flash memory package 200-2 store a busy table T7. A plurality of flash memories 20-$k$1 to 20-$km$ in the flash memory package 200-$k$ store a busy table Ty.

Each of the busy tables T6 to Ty common to the plurality of flash memory packages may store, for example, the average value, the maximum value, or the minimum value of the measured value of the busy time in each of a plurality of pages of the plurality of flash memories 20. In addition, each of the busy tables T6 to Ty may store, for example, the average value, the maximum value, and the minimum value of the measured value of the busy time in each of the plurality of pages of the plurality of flash memories 20, and may control the chip enable signal CEn by selecting any one of the average value, the maximum value, and the minimum value of the measured values of the busy time in the plurality of pages of the flash memory 20 to be controlled depending on various operation processes.

5.2. Effect

As described above, the same effect as that of the fourth embodiment can also be obtained with the fifth embodiment. In addition, in the embodiment, as compared to the fourth embodiment, even if the flash memory 20 to be controlled is changed, as long as the changed flash memory is in the same flash memory package 200, the memory controller 10 does not need to load the busy table into the RAM 12 again.

6. Sixth Embodiment

Next, a sixth embodiment will be described. The sixth embodiment is different from the fifth embodiment, in that all the plurality of nonvolatile memories in a plurality of nonvolatile memory packages store a common busy table. The configuration of the sixth embodiment other than the point that all the plurality of nonvolatile memories in the plurality of nonvolatile memory packages store the common busy table is the same as that of the memory system according to the fifth embodiment. Therefore, the same components are represented by the same reference numerals, and the description thereof will not be repeated.

6.1. Configuration and Operation

A configuration of the memory system according to the sixth embodiment will be described with reference to FIG. 20.

Figure 20:
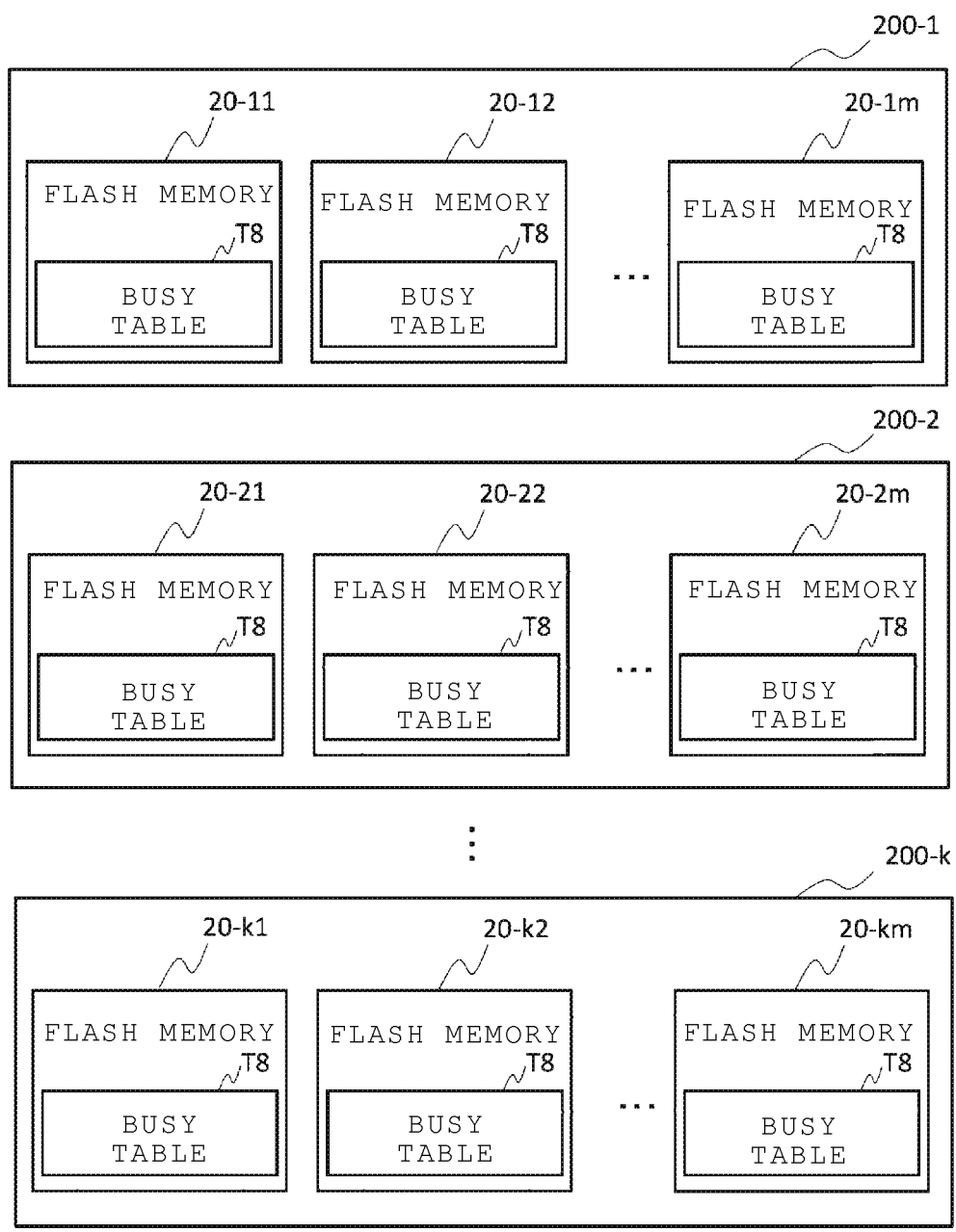
FIG. 20 is a diagram illustrating an example of a configuration of busy tables in a plurality of nonvolatile memories in a memory system according to a sixth embodiment.

FIG. 20 is a diagram illustrating an example of busy tables in the plurality of nonvolatile memories in the memory system according to the sixth embodiment.

As illustrated in FIG. 20, each of the plurality of flash memories 20-11 to 20-$km$ in each of the plurality of flash memory packages 200-1 to 200-$k$ stores a common busy table T8.

The common busy table T8 may store, for example, the average value, the maximum value, or the minimum value of the measured value of the busy time of each of the plurality of flash memory packages 200. In addition, the common busy table T7 may store, for example, the average value, the maximum value, and the minimum value of the measured value of the busy time in each of the plurality of pages of the plurality of flash memory packages 200, and may control the chip enable signal CEn by selecting any one of the average value, the maximum value, and the minimum value of the measured values of the busy time in the flash memory package 200 to be controlled depending on various operation processes.

6.2. Effect

As described above, the same effect as that of the fifth embodiment can also be obtained with the sixth embodiment. In addition, in the embodiment, as compared to the fifth embodiment, even if the flash memory package 200 including the flash memory 20 to be controlled is changed, the memory controller 10 does not need to load the busy table into the RAM 12 again.

In the memory system according to at least one of the embodiments, the nonvolatile memory stores the busy table, loads the busy table stored in the nonvolatile memory into RAM, and controls the chip enable signal based on the busy table loaded in to RAM such that the power consumption can be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
  a nonvolatile memory; and
  a memory controller configured to control the nonvolatile memory,
  wherein the nonvolatile memory stores a busy table, and
  the memory controller loads the busy table and controls a chip enable signal for the nonvolatile memory based on the busy table.

2. The memory system according to claim 1,
  wherein in the busy table, a busy time representing a length of time in which the nonvolatile memory is in a state where the nonvolatile memory cannot receive a command from the memory controller during an operation, is stored.

3. The memory system according to claim 2,
  wherein the operation is at least one of reading, writing, and erasing.

4. The memory system according to claim 1,
  wherein the memory controller includes a timer configured to measure an elapsed time from a start of the operation, and
  the memory controller deasserts the chip enable signal when the timer starts to measure the elapsed time, and asserts the chip enable signal when the elapsed time reaches a busy time stored in the busy table.

5. The memory system according to claim 4,
  wherein the memory controller checks a ready/busy state of the nonvolatile memory when the elapsed time reaches the busy time stored in the busy table, and asserts the chip enable signal if the nonvolatile memory is in a ready state.

6. The memory system according to claim 5,
wherein the memory controller checks the ready/busy state of the nonvolatile memory when the elapsed time reaches the busy time stored in the busy table, and updates the busy table in accordance with the ready/busy state of the nonvolatile memory.

7. The memory system according to claim 6,
wherein the memory controller updates the busy table by decreasing a value of the busy time if the nonvolatile memory is in the ready state when the elapsed time reaches the busy time stored in the busy table.

8. The memory system according to claim 7,
wherein the memory controller updates the busy table by increasing a value of the busy time if the nonvolatile memory is in the busy state when the elapsed time reaches the busy time stored in the busy table.

9. The memory system according to claim 4,
wherein the memory controller updates the busy time stored in the busy table based on the elapsed time.

10. The memory system according to claim 1,
wherein the memory controller loads the busy table when the memory system is powered on.

11. The memory system according to claim 1,
wherein the memory controller includes a volatile memory, and
the busy table is loaded into the volatile memory.

12. A memory system comprising:
a nonvolatile memory storing a busy table; and
a memory controller configured to control the nonvolatile memory, and including a memory in which the busy table is loaded and a timer, the busy table storing a busy time representing a length of time in which the nonvolatile memory is in a state where the nonvolatile memory cannot receive a command from the memory controller during an operation,
wherein the memory controller
controls a chip enable signal for the nonvolatile memory based on the busy table,
measures an elapsed time from a start of the operation using the timer, and
updates the busy table in accordance with a ready/busy state of the nonvolatile memory when the elapsed time reaches the busy time stored in the busy table.

13. The memory system according to claim 12,
wherein the memory controller deasserts the chip enable signal when the timer starts to measure the elapsed time, and asserts the chip enable signal when the elapsed time reaches the busy time stored in the busy table.

14. The memory system according to claim 12,
wherein the memory controller updates the busy time stored in the busy table by decreasing a value of the busy time if the nonvolatile memory is in the ready state when the elapsed time reaches the busy time stored in the busy table.

15. The memory system according to claim 12,
wherein the memory controller updates the busy time stored in the busy table by increasing a value of the busy time if the nonvolatile memory is in the busy state when the elapsed time reaches the busy time stored in the busy table.

16. The memory system according to claim 12,
wherein the memory controller loads the busy table into the memory when the memory system is powered on.

17. The memory system according to claim 12,
wherein the memory is a volatile memory.

18. A memory system comprising:
a nonvolatile memory package including a plurality of nonvolatile memories; and
a memory controller configured to control the plurality of nonvolatile memories,
wherein each of the plurality of nonvolatile memories stores a busy table, and
the memory controller loads the busy table from a nonvolatile memory to be controlled among the plurality of nonvolatile memories and controls a chip enable signal for the nonvolatile memory to be controlled based on the busy table.

19. The memory system according to claim 18,
wherein each of the plurality of nonvolatile memories stores a busy table specific to each of the plurality of nonvolatile memories.

20. The memory system according to claim 18, further comprising:
a plurality of nonvolatile memory packages, and each of the plurality of nonvolatile memory packages including a plurality of nonvolatile memories,
wherein the same busy table is stored in each of the plurality of nonvolatile memories.

* * * * *